United States Patent
Cok

(10) Patent No.: US 9,128,572 B2
(45) Date of Patent: Sep. 8, 2015

(54) MAKING TOUCH SCREENS WITH DIAMOND-PATTERNED MICRO-WIRE ELECTRODE

(75) Inventor: Ronald Steven Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 580 days.

(21) Appl. No.: 13/591,325

(22) Filed: Aug. 22, 2012

(65) Prior Publication Data

US 2014/0057043 A1    Feb. 27, 2014

(51) Int. Cl.
*H05B 33/10* (2006.01)
*G06F 3/044* (2006.01)
*H01L 51/52* (2006.01)
*H01L 27/32* (2006.01)

(52) U.S. Cl.
CPC .............. *G06F 3/044* (2013.01); *H01L 27/323* (2013.01); *H01L 51/5209* (2013.01); *H01L 51/5225* (2013.01); *H01L 51/5234* (2013.01)

(58) Field of Classification Search
CPC ....................................................... G06F 3/044
See application file for complete search history.

(56) References Cited

U.S. PATENT DOCUMENTS

| 3,223,525 | A | 12/1965 | Jonker et al. |
| 6,645,444 | B2 | 11/2003 | Goldstein |
| 6,812,637 | B2 | 11/2004 | Cok et al. |
| 7,663,607 | B2 | 2/2010 | Hotelling et al. |
| 2006/0057502 | A1 | 3/2006 | Okada et al. |
| 2010/0026604 | A1 | 2/2010 | Caldwell et al. |
| 2010/0302201 | A1 | 12/2010 | Ritter et al. |
| 2011/0007011 | A1 | 1/2011 | Mozdzyn |
| 2011/0099805 | A1 | 5/2011 | Lee |
| 2011/0210935 | A1* | 9/2011 | Chuang .......................... 345/174 |
| 2011/0289771 | A1 | 12/2011 | Kuriki |
| 2011/0291966 | A1 | 12/2011 | Takao et al. |
| 2012/0031746 | A1 | 2/2012 | Hwang et al. |
| 2012/0162116 | A1* | 6/2012 | Philipp .......................... 345/173 |

OTHER PUBLICATIONS

U.S. Appl. No. 13/046,649, filed Feb. 28, 2012, Cok.

* cited by examiner

*Primary Examiner* — Nathan T Leong
(74) *Attorney, Agent, or Firm* — Raymond L. Owens

(57) ABSTRACT

A method of making a display device includes providing a first substrate having an array of pixels located in correspondence thereto. The pixels are separated by inter-pixel gaps. A first electrode having a length direction is located over the first substrate and extends across at least a portion of the array of pixels, the first electrode including a plurality of electrically connected micro-wires formed in a micro-pattern. The micro-pattern has a first set of parallel micro-wires oriented at a first angle non-orthogonal to the length direction and a second set of parallel micro-wires oriented at a second angle non-orthogonal to the length direction different from the first angle. The micro-wires of the first and second sets intersect to form an array of electrically connected micro-wire intersections. At least every other micro-wire intersection on the micro-wires of the first set is located between the pixels in the inter-pixel gaps.

19 Claims, 25 Drawing Sheets

MAKING TOUCH SCREENS WITH DIAMOND-PATTERNED MICRO-WIRE ELECTRODE

CROSS REFERENCE TO RELATED APPLICATIONS

Reference is made to commonly-assigned, co-pending U.S. patent application Ser. No. 13/591,283 filed Aug. 22, 2012, entitled "Pixel-Aligned Diamond-Patterned Micro-Wire Electrode" by Ronald S. Cok, and U.S. patent application Ser. No. 13/591,296 filed Aug. 22, 2012 (issued Dec. 30, 2014), entitled "Display Apparatus With Diamond-Patterned Micro-Wire Electrode" by Ronald S. Cok, the disclosure of which is incorporated herein.

Reference is made to commonly assigned U.S. patent application Ser. No. 13/587,152 filed Aug. 16, 2012, entitled "Pixel-Aligned Micro-Wire Electrode Device" by Ronald S. Cok, the disclosure of which is incorporated herein.

FIELD OF THE INVENTION

The present invention relates to micro-wire transparent electrodes and their use in a capacitive touch-screen display apparatus.

BACKGROUND OF THE INVENTION

Transparent conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Touch screens with transparent electrodes are widely used with electronic displays, especially for mobile electronic devices. Such devices typically include a touch screen mounted over an electronic display that displays interactive information. Touch screens mounted over a display device are largely transparent so a user can view displayed information through the touch-screen and readily locate a point on the touch-screen to touch and thereby indicate the information relevant to the touch location. By physically touching, or nearly touching, the touch screen in a location associated with particular information, a user can indicate an interest, selection, or desired manipulation of the associated particular information. The touch screen detects the touch and then electronically interacts with a processor to indicate the touch and touch location. The processor can then associate the touch and touch location with displayed information to execute a programmed task associated with the information. For example, graphic elements in a computer-driven graphic user interface are selected or manipulated with a touch screen mounted on a display that displays the graphic user interface.

Touch screens use a variety of technologies, including resistive, inductive, capacitive, acoustic, piezoelectric, and optical technologies. Such technologies and their application in combination with displays to provide interactive control of a processor and software program are well known in the art. Capacitive touch-screens are of at least two different types: self-capacitive and mutual-capacitive. Self-capacitive touch-screens employ an array of transparent electrodes, each of which in combination with a touching device (e.g. a finger or conductive stylus) forms a temporary capacitor whose capacitance is detected. Mutual-capacitive touch-screens can employ an array of transparent electrode pairs that form capacitors whose capacitance is affected by a conductive touching device. In either case, each capacitor in the array is tested to detect a touch and the physical location of the touch-detecting electrode in the touch-screen corresponds to the location of the touch. For example, U.S. Pat. No. 7,663,607 discloses a multipoint touch-screen having a transparent capacitive sensing medium configured to detect multiple touches or near touches that occur at the same time and at distinct locations in the plane of the touch panel and to produce distinct signals representative of the location of the touches on the plane of the touch panel for each of the multiple touches. The disclosure teaches both self- and mutual-capacitive touch-screens.

Referring to FIG. 20, a prior-art display and touch-screen apparatus 100 includes a display 110 with a corresponding touch screen 120 mounted with the display 110 so that information displayed on the display 110 can be viewed through the touch screen 120. Graphic elements displayed on the display 110 are selected, indicated, or manipulated by touching a corresponding location on the touch screen 120. The touch screen 120 includes a first transparent substrate 122 with first transparent electrodes 130 formed in the x dimension on the first transparent substrate 122 and a second transparent substrate 126 with second transparent electrodes 132 formed in the y dimension facing the x-dimension first transparent electrodes 130 on the second transparent substrate 126. A transparent dielectric layer 124 is located between the first and second transparent substrates 122, 126 and first and second transparent electrodes 130, 132. Referring also to the plan view of FIG. 21, in this example first pad areas 128 in the first transparent electrodes 130 are located adjacent to second pad areas 129 in the second transparent electrodes 132. (The first and second pad areas 128, 129 are separated into different parallel planes by the transparent dielectric layer 124.) The first and second transparent electrodes 130, 132 have a variable width and extend in orthogonal directions (for example as shown in U.S. Patent Publication Nos. 2011/0289771 and 2011/0099805). When a voltage is applied across the first and second transparent electrodes 130, 132, electric fields are formed between the first pad areas 128 of the x-dimension first transparent electrodes 130 and the second pad areas 129 of the y-dimension second transparent electrodes 132.

A display controller 142 (FIG. 20) connected through electrical buss connections 136 controls the display 110 in cooperation with a touch-screen controller 140. The touch-screen controller 140 is connected through electrical buss connections 136 and wires 134 and controls the touch screen 120. The touch-screen controller 140 detects touches on the touch screen 120 by sequentially electrically energizing and testing the x-dimension first and y-dimension second transparent electrodes 130, 132.

Referring to FIG. 22, in another prior-art embodiment, rectangular first and second transparent electrodes 130, 132 are arranged orthogonally on first and second transparent substrates 122, 126 with intervening transparent dielectric layer 124, forming touch screen 120 which, in combination with the display 110 forms a touch screen and display apparatus 100. In this embodiment, first and second pad areas 128, 129 coincide and are formed where the first and second transparent electrodes 130, 132 overlap. The touch screen 120 and display 110 are controlled by touch screen and display controllers 140, 142, respectively, through electrical buss connections 136 and wires 134.

Since touch-screens 120 are largely transparent, any electrically conductive materials located in the transparent portion of the touch-screen 120 either employ transparent conductive materials or employ conductive elements that are spaced apart and are too small to be readily resolved by the eye of a touch-screen user. Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. However, the current-carrying capacity of such electrodes is limited, thereby limiting the amount of power that can be supplied to the pixel elements. Moreover, the substrate materials are limited by the electrode material deposition process (e.g. sputtering). Thicker layers of metal oxides or metals increase conductivity but reduce the transparency of the electrodes.

Various methods of improving the conductivity of transparent conductors are taught in the prior art. For example, U.S. Pat. No. 6,812,637 entitled "OLED Display with Auxiliary Electrode" by Cok, describes an auxiliary electrode for OLED pixels to improve the conductivity of the transparent electrode and enhance the current distribution. Such auxiliary electrodes are typically provided in areas that do not block light emission, e.g., as part of a black-matrix structure.

It is also known in the prior art to form conductive traces using nano-particles including, for example silver. The synthesis of such metallic nano-crystals is known. For example, issued U.S. Pat. No. 6,645,444 entitled "Metal nano-crystals and synthesis thereof" describes a process for forming metal nano-crystals optionally doped or alloyed with other metals. U.S. Patent Application Publication No. 2006/0057502 entitled "Method of forming a conductive wiring pattern by laser irradiation and a conductive wiring pattern" describes fine wirings made by drying a coated metal dispersion colloid into a metal-suspension film on a substrate, pattern-wise irradiating the metal-suspension film with a laser beam to aggregate metal nano-particles into larger conductive grains, removing non-irradiated metal nano-particles, and forming metallic wiring patterns from the conductive grains. However, such wires are not transparent and thus the number and size of the wires limits the substrate transparency as the overall conductivity of the wires increases.

Touch-screens, including very fine patterns of conductive elements, such as metal wires or conductive traces are known. For example, U.S. Patent Publication No. 2011/0007011 teaches a capacitive touch screen with a mesh electrode, as does U.S. Patent Publication No. 2010/0026664. Referring to FIG. 23, a prior-art x- or y-dimension variable-width first or second transparent electrode 130, 132 includes a micro-pattern 156 of micro-wires 150 arranged in a rectangular grid or mesh. The micro-wires 150 are very thin metal conductive traces or wires formed on the first and second transparent substrates 122, 126 (not shown in FIG. 23) to form the x- or y-dimension first or second transparent electrodes 130, 132. The micro-wires 150 are so narrow that they are not readily visible to a human observer, for example 1 to 10 microns wide. The micro-wires 150 are typically opaque and spaced apart, for example by 50 to 500 microns, so that the first or second transparent electrodes 130, 132 appear to be transparent and the micro-wires 150 are not distinguished by an observer.

It is known that micro-wire electrodes in a touch-screen can visibly interact with pixels in a display and various layout designs are disclosed to avoid such visible interaction. Thus, the pattern of micro-wires in a transparent electrode is important for optical as well as electrical reasons.

A variety of layout patterns are known for micro-wires used in transparent electrodes. U.S. Patent Publication 2010/0302201 teaches that a lack of optical alignment between the rows and columns of the underlying LCD pixels and the overlying diamond-shaped electrodes having edges arranged at 45 degree angles with respect to the underlying rectangular grid of LCD pixels results in a touch-screen largely free from the effects of Moiré patterns or other optical interference effects that might otherwise arise from light reflecting, scattering, refracting or otherwise interacting between the underlying pattern of LCD pixels and the overlying pattern of drive and sense electrodes in undesired or unexpected ways.

U.S. Patent Publication No. 2012/0031746 discloses a number of micro-wire electrode patterns, including regular and irregular arrangements. The conductive pattern of micro-wires in a touch screen can be formed by closed figures distributed continuously in an area of 30% or more, preferably 70% or more, and more preferably 90% or more of an overall area of the substrate and can have a shape where a ratio of standard deviation for an average value of areas of the closed figures (a ratio of area distribution) can be 2% or more. As a result, a Moiré phenomenon can be prevented and excellent electric conductivity and optical properties can be satisfied. U.S. Patent Publication No. 2012/0162116 discloses a variety of micro-wire patterns configured to reduce interference patterns.

U.S. Patent Publication No. 2011/0291966 discloses an array of diamond-shaped micro-wire structures. In this disclosure, a first electrode includes a plurality of first conductor lines inclined at a predetermined angle in clockwise and counterclockwise directions with respect to a first direction and provided at a predetermined interval to form a grid-shaped pattern. A second electrode includes a plurality of second conductor lines, inclined at the predetermined angle in clockwise and counter-clockwise, directions with respect to a second direction, the second direction perpendicular to the first direction and provided at the predetermined interval to form a grid-shaped pattern. This arrangement is used to inhibit Moiré patterns. The electrodes are used in a touch screen device. Referring to FIG. 24, micro-wires 150 are arranged in a micro-pattern 156 with the micro-wires 150 oriented at an angle to the direction of a vertical second transparent electrode 132. As shown in FIG. 25, two such orthogonal electrodes can be located on opposing sides of a substrate to form overlapping capacitor areas. This prior-art design includes micro-wires 150 arranged in a micro-pattern 156 with the micro-wires 150 oriented at an angle to the direction of horizontal first transparent electrodes 130 and vertical second transparent electrodes 132.

Mutual-capacitive touch screens typically include arrays of capacitors whose capacitance is repeatedly tested to detect a touch. In order to detect touches rapidly, highly conductive electrodes are useful. In order to readily view displayed information on a display at a display location through a touch screen without visibly affecting any light emitted from an underlying display, it is useful to have a highly transparent touch screen. There is a need, therefore, for an improved method and device for providing electrodes with increased conductivity and transparency in a mutually capacitive touch-screen device.

SUMMARY OF THE INVENTION

In accordance with the present invention, a method of making a display device comprises:

providing a first substrate having an array of pixels located in correspondence thereto, the pixels separated by inter-pixel gaps in at least one dimension;

forming a first electrode having a length direction located over the first substrate and extending across at least a portion of the array of pixels, the first electrode including a plurality of electrically connected micro-wires formed in a first micro-pattern; and wherein the first micro-pattern has a first set of parallel micro-wires oriented at a first angle non-orthogonal to the length direction and a second set of parallel micro-wires oriented at a second angle non-orthogonal to the length direction different from the first angle, the micro-wires of the first and second sets intersecting to form an array of electrically connected micro-wire intersections; and wherein at least every other micro-wire intersection on the micro-wires of the first set is located between the pixels in the inter-pixel gaps.

The present invention provides a display and touch screen device and apparatus with improved transparency and fewer optical interactions with light emitted, reflected, or transmitted from display pixels. The device of the present invention is particularly useful in capacitive touch screen devices.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein.

The Figures are not drawn to scale since the variation in size of various elements in the Figures is too great to permit depiction to scale.

DETAILED DESCRIPTION OF THE INVENTION

Figure 1:
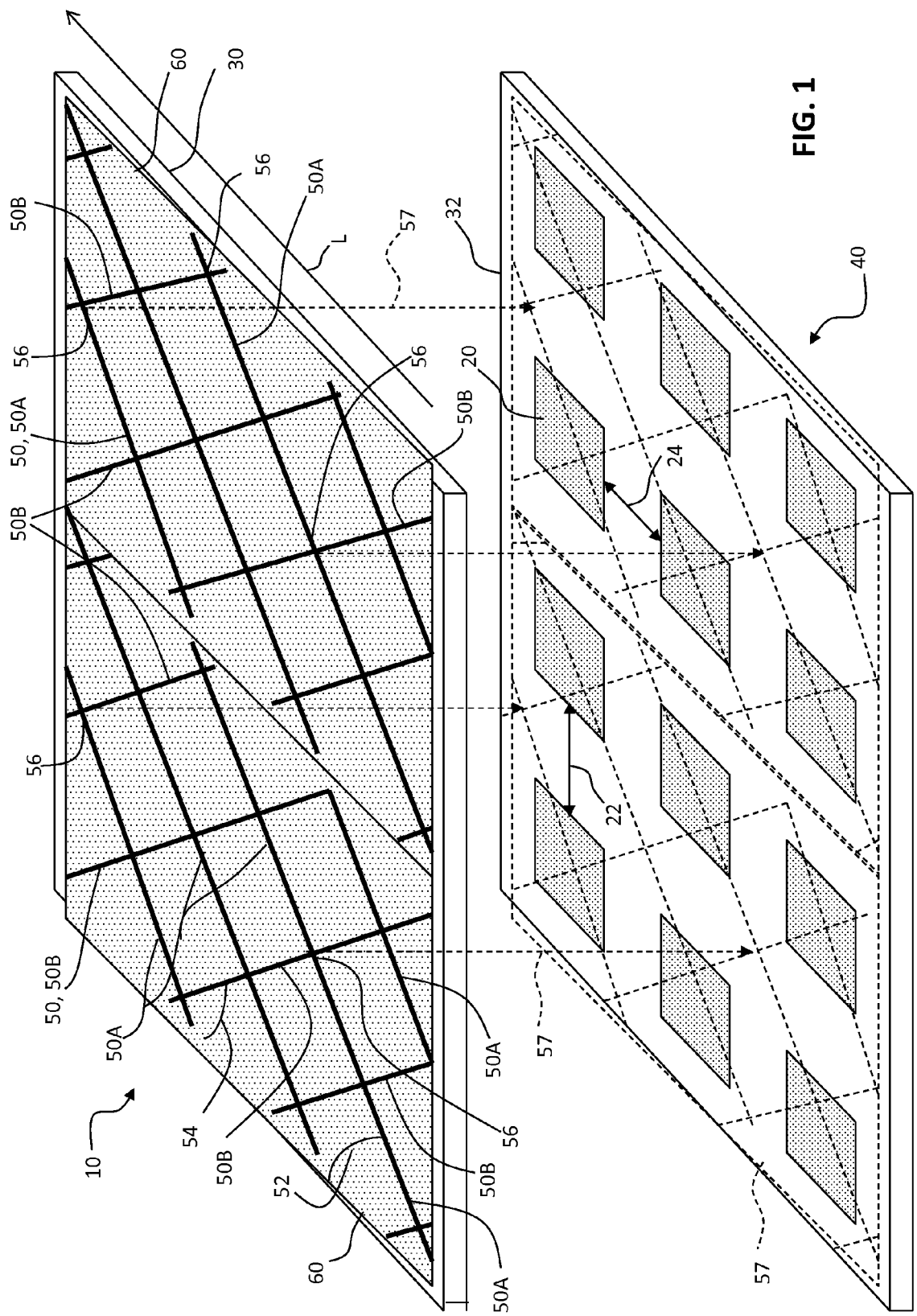
FIG. 1 is an exploded perspective of an embodiment of the present invention.

Referring to FIG. 1 in an embodiment of the present invention, a display device 10 includes a display 40 having an array of pixels 20. Pixels 20 are separated by column or row inter-pixel gaps 22 or 24 in at least one dimension. Pixels are single light-controlling elements that, in color displays, can be called sub-pixels. For the purposes of the present invention, pixels and sub-pixels are equivalent, single, light-controlling elements of a display. As shown in FIG. 1, column inter-pixel gaps 22 are located between columns of pixels 20 and row inter-pixel gaps 24 are located between rows of pixels 20. An electrode 60 having a length direction L is located over display 40 and extends across at least a portion of the array of pixels 20. Electrode 60 includes a plurality of electrically connected micro-wires 50, 50A, 50B formed in a micro-pattern. The micro-pattern has a first set of parallel micro-wires 50A oriented at a first angle 52 non-orthogonal to length direction L and a second set of parallel micro-wires 50B oriented at a second angle 54 non-orthogonal to length direction L different from first angle 52.

Micro-wires 50A, 50B of the first and second sets are micro-wires 50 that intersect to form an array of micro-wire intersections 56. At least every other micro-wire intersection 56 on micro-wires 50A of the first set is located between pixels 20 in the column and row inter-pixel gaps 22, 24. Thus, at least one half of micro-wire intersections 56 of either, or both, of the first or second set of micro-wires 50A, 50B are located between pixels 20, as illustrated with projection lines 57 extending orthogonally from a surface on which micro-wires 50 are formed onto a surface on which pixels 20 are formed. Projection lines 57 also illustrate the location of micro-wires 50 projected onto a surface of display 40.

Micro-wires 50 can be formed on a substrate 30 surface and pixels 20 can be formed on a display substrate 32 surface. The respective surfaces can be formed on opposite sides of the same substrate (i.e. substrate 30 and display substrate 32 can be the same substrate or different substrates).

As shown in the perspective of FIG. 1, parallel micro-wires 50A of the first set extend from the lower left to the upper right while parallel micro-wires 50B of the second set extend from the upper left to the lower right of substrate 30. Micro-wires 50A of the first set and micro-wires 50B of the second set are formed in a common plane or on a common surface (e.g. a surface of substrate 30) and form an electrically connected mesh of micro-wires 50. Micro-wires 50A, 50B can be identical (except for their orientation), made of the same materials, or made with the same processes and at the same time. (As used herein, micro-wires 50A and micro-wires 50B are referred to together as micro-wires 50.) Micro-wires 50A of the first set can be orthogonal to micro-wires 50B or can intersect at other angles, for example 30 degrees, 45 degrees, or 60 degrees.

Figure 2:
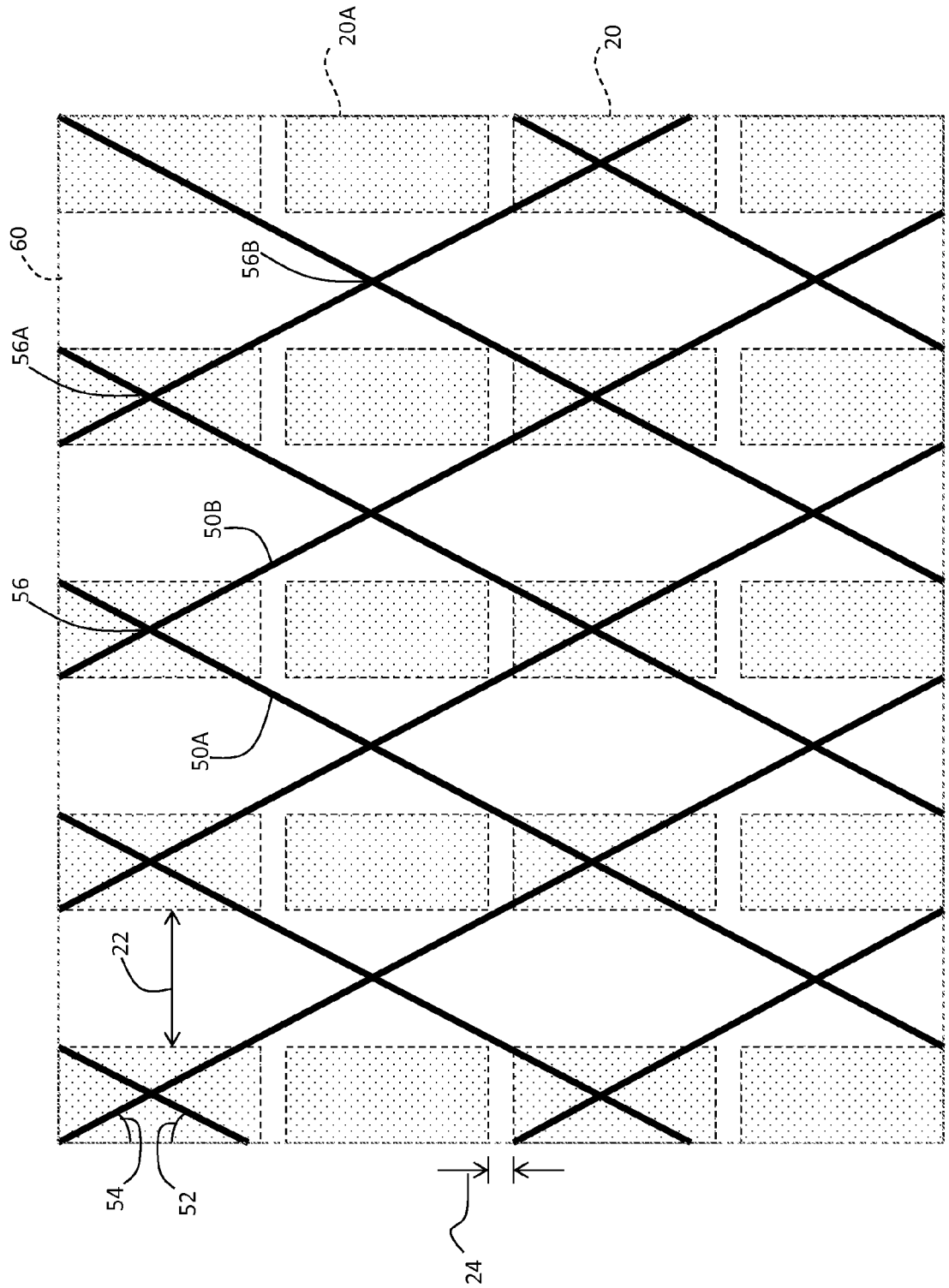
FIGS. 2-10 are plan views of various micro-wire electrodes illustrating a corresponding variety of embodiments of the present invention.

As illustrated further in the plan view of FIG. 2, micro-wires 50A and micro-wires 50B making up electrode 60 can be regularly spaced apart (and can have the same spacing) and intersect to form micro-wire intersections 56. In the embodiment of FIG. 2, one half of micro-wire intersections 56 are located over a pixel 20; those micro-wire intersections 56 are designated 56A. The other half of micro-wire intersections 56 are located in column inter-pixel gaps 22 but not in row inter-pixel gaps 24 and are designated 56B.

Figure 3:
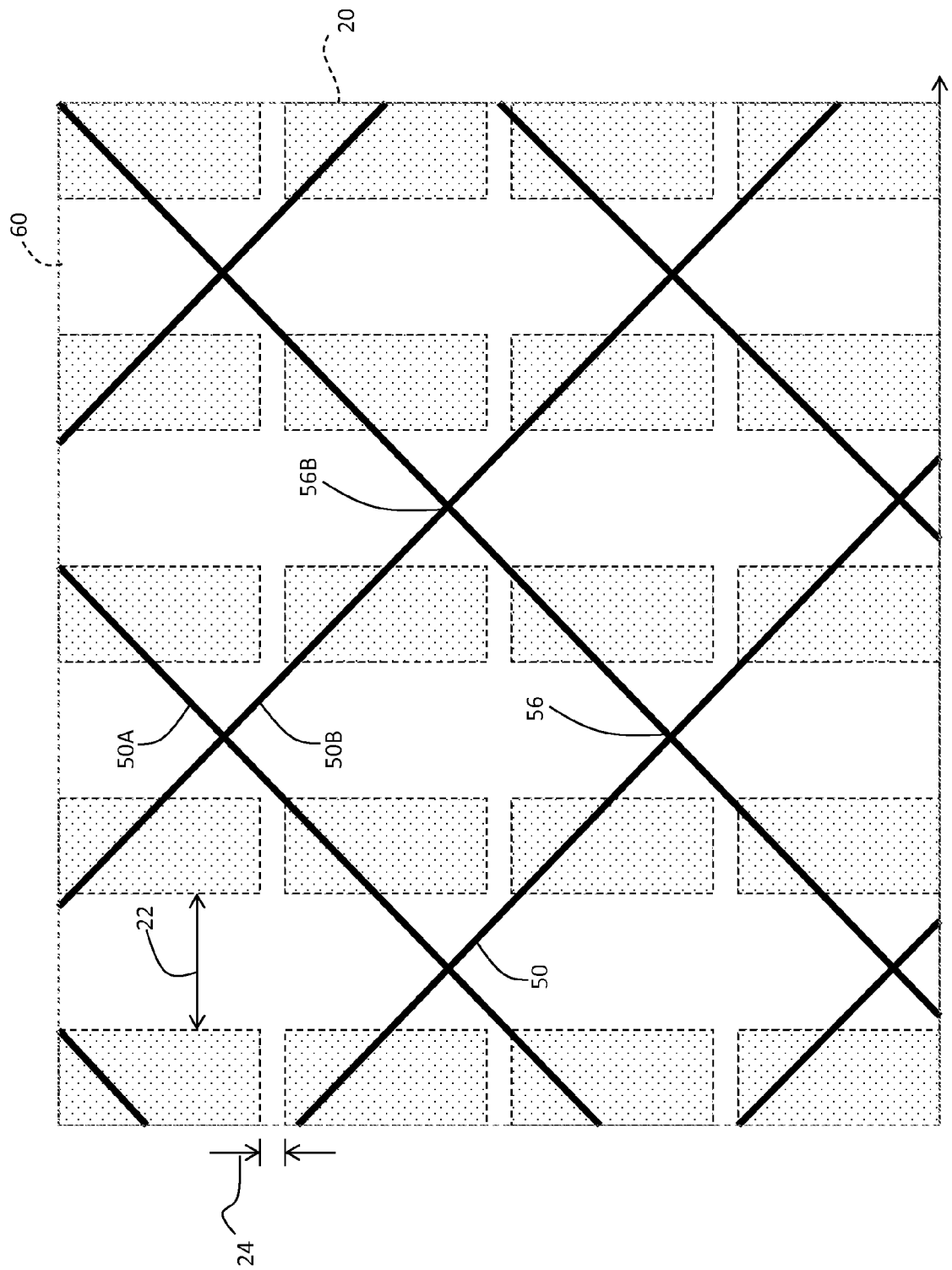

Referring to FIG. 3, in another embodiment of the present invention, every micro-wire intersection 56 formed by micro-wires 50 (e.g. 50A and 50B) of electrode 60 is located in a column inter-pixel gap 22. As shown, every micro-wire intersection 56B is located in a column inter-pixel gap 22 but not in a row inter-pixel gap 24. Micro-wires 50 cover an equal portion of each of pixels 20 and can occlude equal amounts of light controlled by pixels 20.

Figure 4:
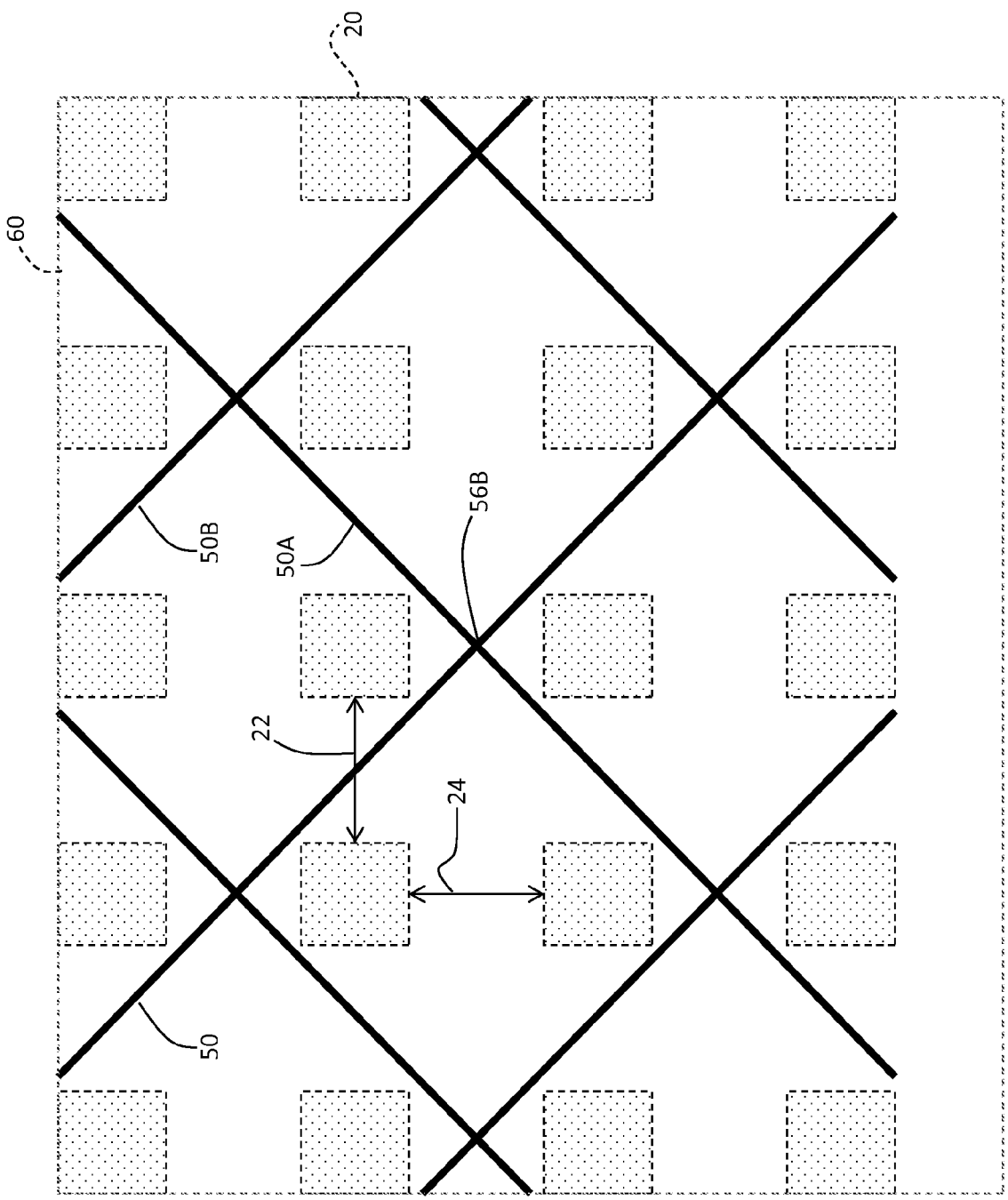

Referring to FIG. 4, in another embodiment of the present invention, every micro-wire intersection 56 (not shown) formed by micro-wires 50 (e.g. 50A and 50B) of electrode 60 is located in a row inter-pixel gap 24. As shown, every micro-wire intersection 56B is located in row inter-pixel gaps 24 but not in column inter-pixel gaps 22. No portion of any pixel 20 is covered by any of micro-wires 50.

Figure 5:
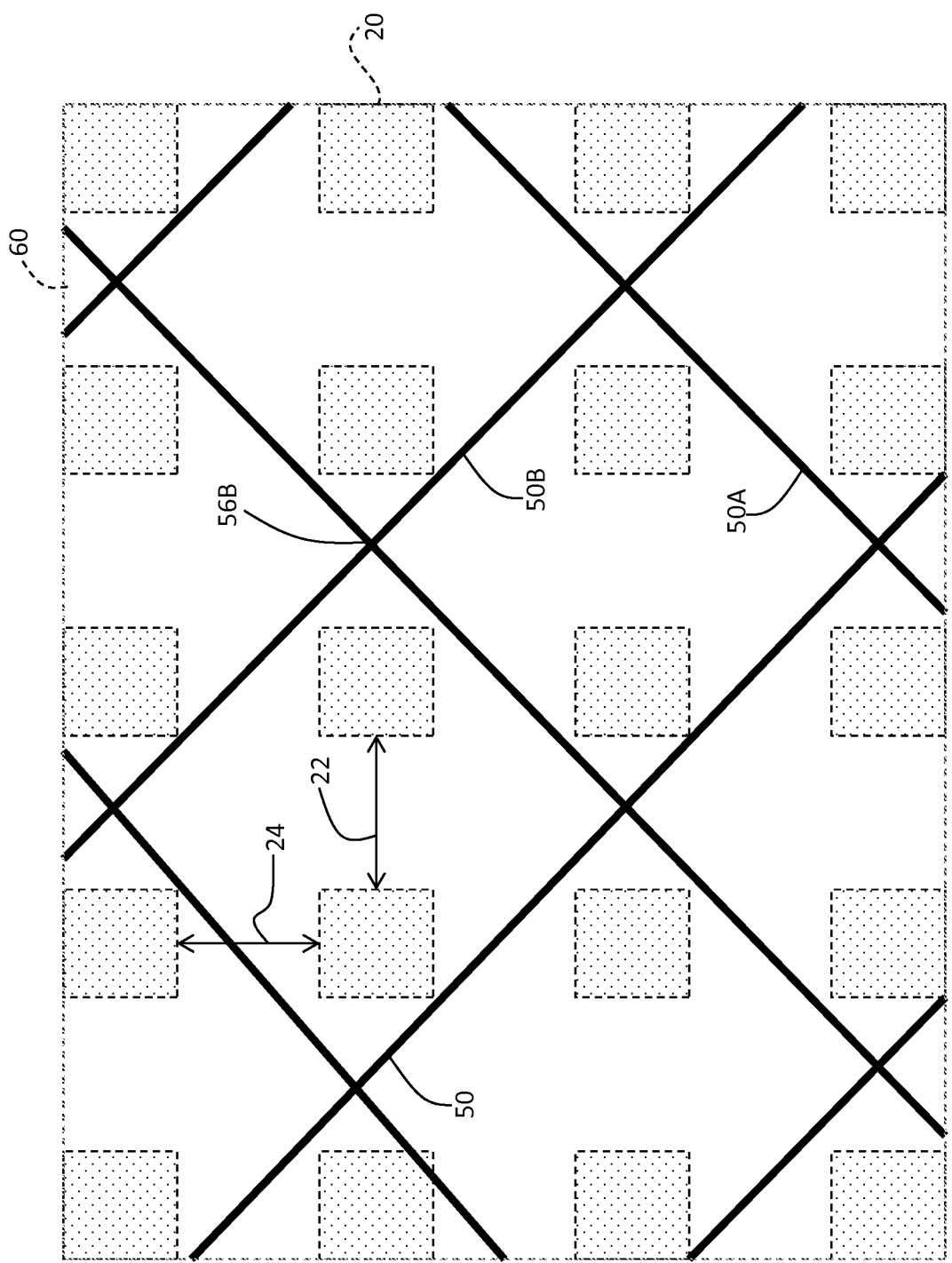

Referring to FIG. 5, in another embodiment of the present invention, every micro-wire intersection 56 (not shown) formed by micro-wires 50 (e.g. 50A and 50B) of electrode 60 is located in a column inter-pixel gap 22. As shown, every micro-wire intersection 56B is located in column inter-pixel gaps 22 but not in row inter-pixel gaps 24. No portion of any pixel 20 is covered by any of micro-wires 50.

Figure 6:
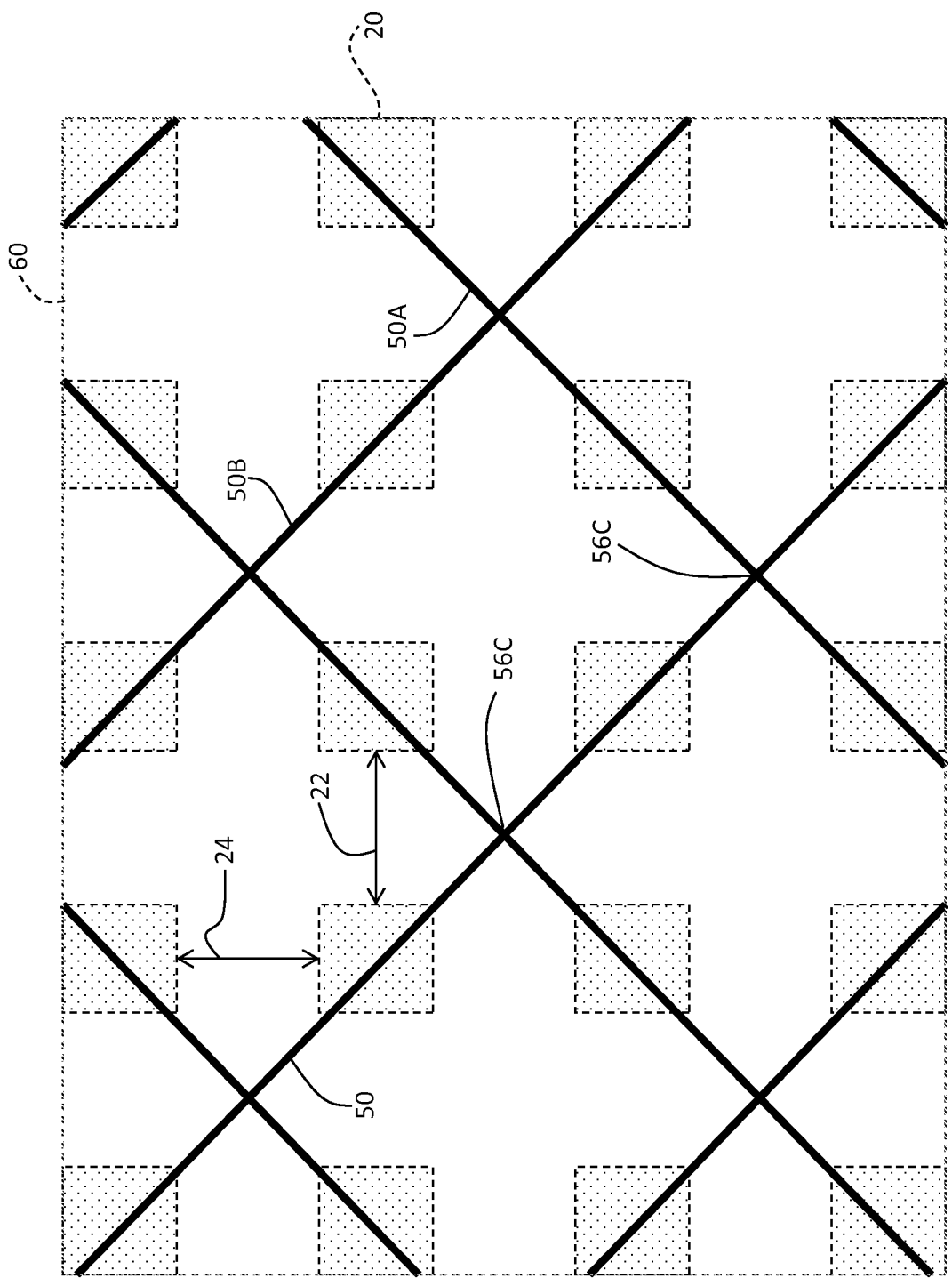

Referring to FIG. 6, in another embodiment of the present invention, every micro-wire intersection 56 (not shown) formed by micro-wires 50 (e.g. 50A and 50B) of electrode 60 is located in column or row inter-pixel gap 22, 24. As shown, every micro-wire intersection 56C is located in column inter-pixel gaps 22 and in row inter-pixel gaps 24. Micro-wires 50 cover an equal portion of each of pixels 20.

Figure 7:
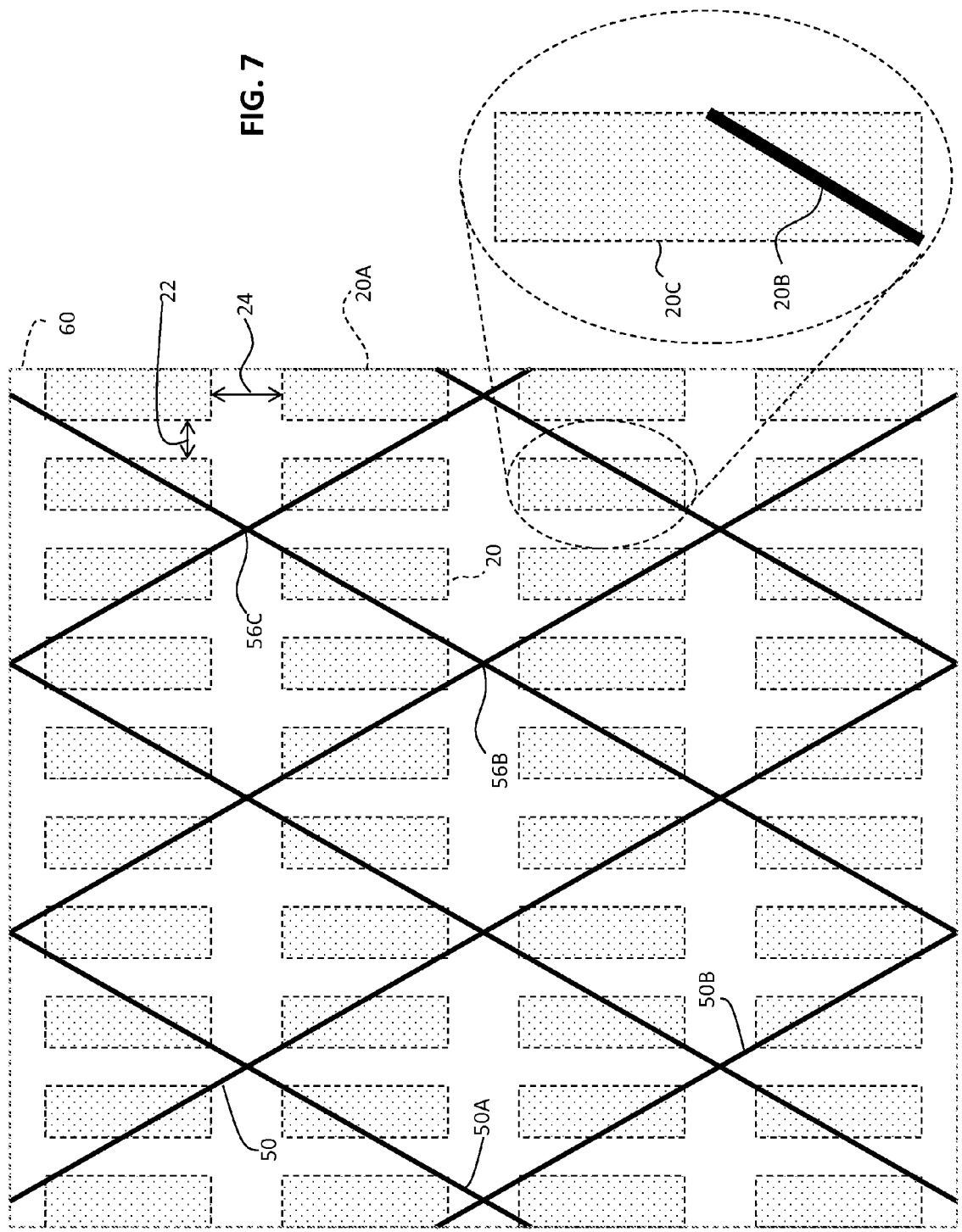

Referring to FIG. 7, in an alternative embodiment of the present invention, micro-wire intersections 56C formed by micro-wires 50 (e.g. 50A and 50B) of electrode 60 are located in column inter-pixel gaps 22 and in row inter-pixel gaps 24. Micro-wire intersections 56B formed by micro-wires 50 (e.g. 50A and 50B) of electrode 60 are located in row inter-pixel gaps 24. Micro-wires 50 cover different portions of different pixels 20 so that some of pixels 20 are more covered by micro-wires 50 than other pixels 20A.

Display pixels 20, particularly for flat-panel displays, control light emission, transmission, or reflection over an area defining pixel 20, for example with thin-film transistors controlling current flow through, or voltage across, a pair of electrodes. The current flow can cause light emission (e.g. with organic light-emitting diodes) or control the transmission of light (e.g. with liquid crystals) over an area. According to various embodiments of the present invention, a light-controlling area is partially covered by micro-wires 50 forming covered areas 20B and remaining areas 20C that are not covered for each pixel 20. When a pixel 20 is partially covered, light emitted, transmitted, or reflected in covered area 20B is occluded and, in some cases, light in covered areas 20B of a pixel 20 is absorbed (for example by an opaque micro-wire 56).

If every pixel 20 is equally covered with a micro-wire 50, for example as in FIGS. 3 and 6, or not covered at all, for example as in FIGS. 4 and 5, pixels 20 can uniformly output light when controlled in the same way with the same signal (for example through thin-film transistors controlling pixel 20 in response to identical control signals). If however, as shown in FIGS. 2 and 7, different pixels 20 are driven with the same signal, different amounts of light can be output. As shown in FIGS. 2 and 7, pixels 20 are partially covered by one or more micro-wires 50 more than pixels 20A are partially covered by one or more micro-wires 50.

Figure 8:
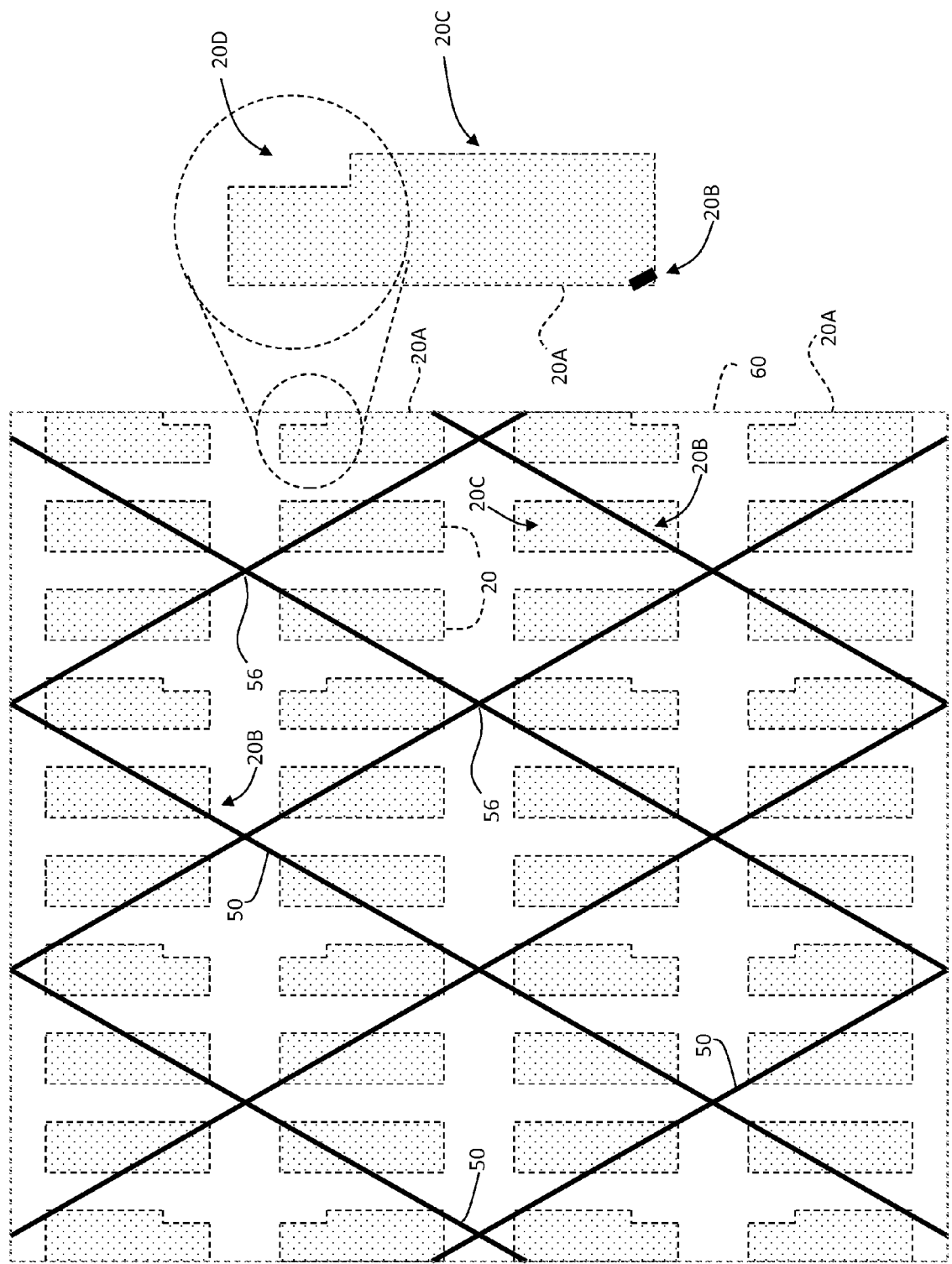

Referring to FIG. 8, the light-controlling areas of pixels 20A are reduced by an amount equal to the difference in covered area 20B of pixels 20 and covered areas 20B of pixels 20A, so that the size of remaining areas 20C of pixel 20 and pixel 20A are the same. In an alternative embodiment, pixels 20A are not covered by micro-wires 50 of electrode 60 at all (e.g. as in FIG. 2). In this case, the light-controlling areas of pixels 20A are reduced by an amount equal to covered area 20B of pixels 20, so that the size of light-controlling area 20C of pixel 20 is the same as remaining area 20C of pixel 20A. The light-controlling area of a pixel (e.g. pixel 20A) is reduced by patterning the pixel area (e.g. a pixel electrode area) with a smaller area having a missing pixel portion 20D. Materials, methods, processes, and manufacturing equipment for laying out pixels 20 in a pattern on a substrate 30, making the pixels 20, and controlling them are all well known in the art.

Alternatively, pixels 20A can be controlled to emit, transmit, or reflect light differently than pixels 20. If identical signals for pixels 20 and 20A are received by a display controller (e.g. controller 142 FIG. 20), controller 142 can compensate the signals so that the light output from all of pixels 20 is the same. This is readily accomplished by reducing the magnitude of the control signal for pixels 20A by an amount equal to the ratio of the difference in remaining areas 20C for pixels 20, 20A or reducing the control signal for pixels 20A by an amount equal to the ratio of the difference of the remaining areas 20C for pixel 20 and the light-controlling area of pixel 20A. The amount is the signal level required to control the actual light output from a pixel 20 or 20A.

A remaining area 20C can be controlled to emit, transmit, or reflect the same amount of light as a second light-controlling area in response to a common signal provided for the first pixel 20 and for the second pixel 20 are known. For example, digital integrated circuits such as processors, gate arrays, and programmable logic arrays having logic circuits, computing elements, memory, and software or firmware programs are all well known in the art and can be employed. Alternatively, lookup tables (e.g. a three-dimensional lookup table) converting one value to another value are well known in the computer arts and can be employed. The input values can be a signal level and memory pixel address associated with a pixel and the output value can be the corrected value useful to drive the pixel with the appropriate signal to accomplish the desired light control corresponding to the signal level. These control elements can be provided by a touch screen or display controller (e.g. 140, 142) shown in FIG. 20.

In an embodiment of the present invention, micro-wires 50 form straight line segments. In another embodiment, the micro-pattern of micro-wires 50 forms an array of diamond shapes. A diamond shape is a rhombus. In an embodiment, the diamond shape is a rhombus oriented so that an axis connecting opposite vertices of the rhombus is parallel to length direction L of an electrode 60.

In other embodiments, first angle 52 has the same magnitude as second angle 54. Second angle 54 can be a reflection of first angle 52 with respect to length direction L (as shown in FIGS. 2-8). First or second angles 52, 54 can be 30 degrees, 45 degrees, or 60 degrees.

In one embodiment of the present invention (e.g. FIGS. 1-8), the array of pixels 20 forms straight rows of pixels 20 arranged in a row direction and straight columns of pixels 20 formed in a column direction orthogonal to the row direction. Rows of pixels 20 are separated by row inter-pixel gaps 24 and the columns of pixels 20 are separated by column inter-pixel gaps 22 and either the row direction or the column direction is length direction L. In another embodiment, illustrated in FIG. 9, the array of pixels 20 forms rows of pixels 20 arranged in a row direction and columns of pixels 20 formed in a column direction orthogonal to the row direction. Each row is spatially offset from adjacent rows. The rows of pixels 20 are separated by row inter-pixel gaps 24 and the columns of pixels 20 separated by column inter-pixel gaps 22. Alternatively, as illustrated in FIG. 10, each column is spatially offset from adjacent columns. The rows of pixels 20 are separated by row inter-pixel gaps 24 and the columns of pixels 20 are separated by column inter-pixel gaps 22. In all of these cases, electrodes 60 include micro-wires 50A that intersect with micro-wires 50B to form micro-wire intersections 56B between pixels 20.

Figure 9:
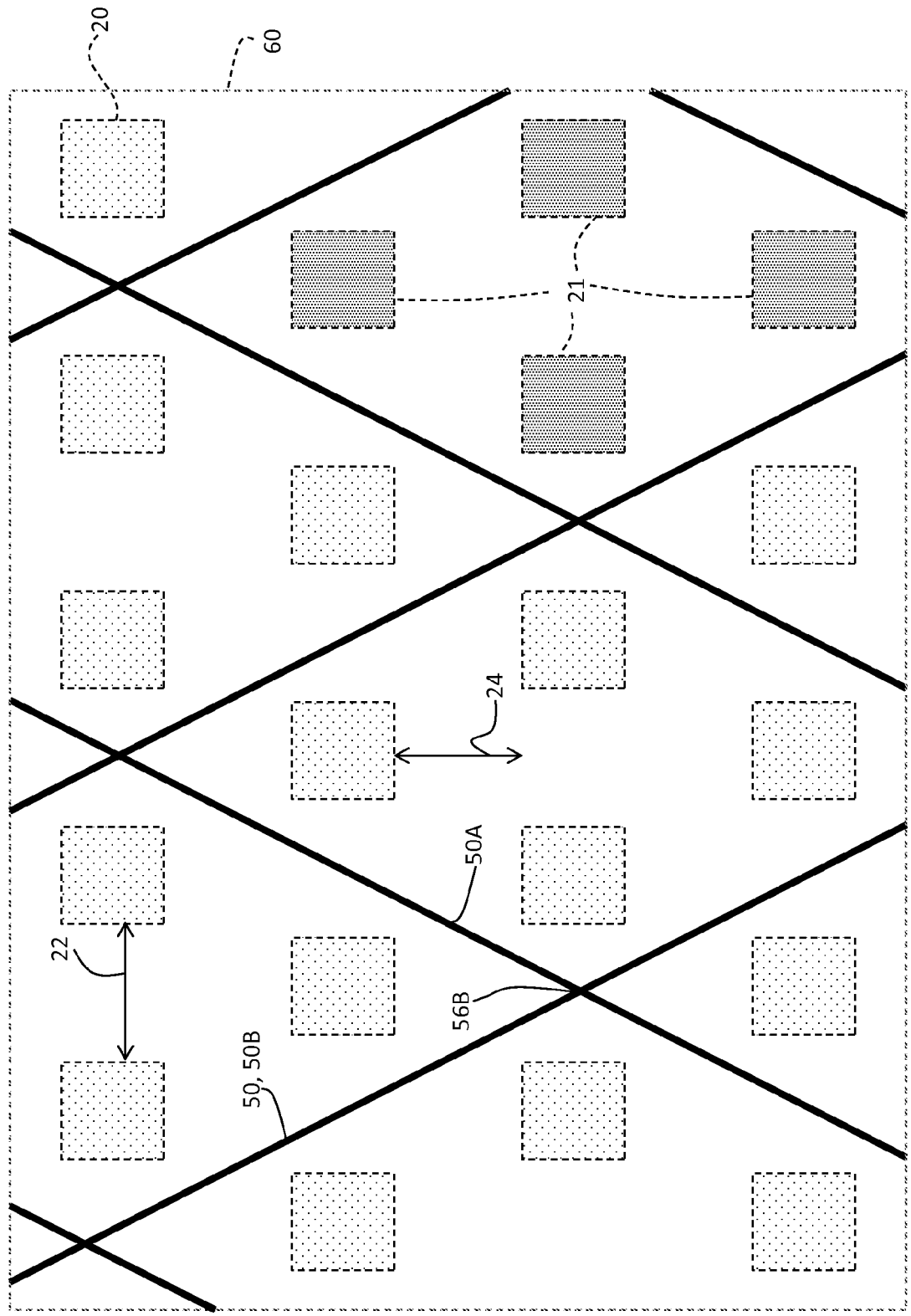
Figure 10:
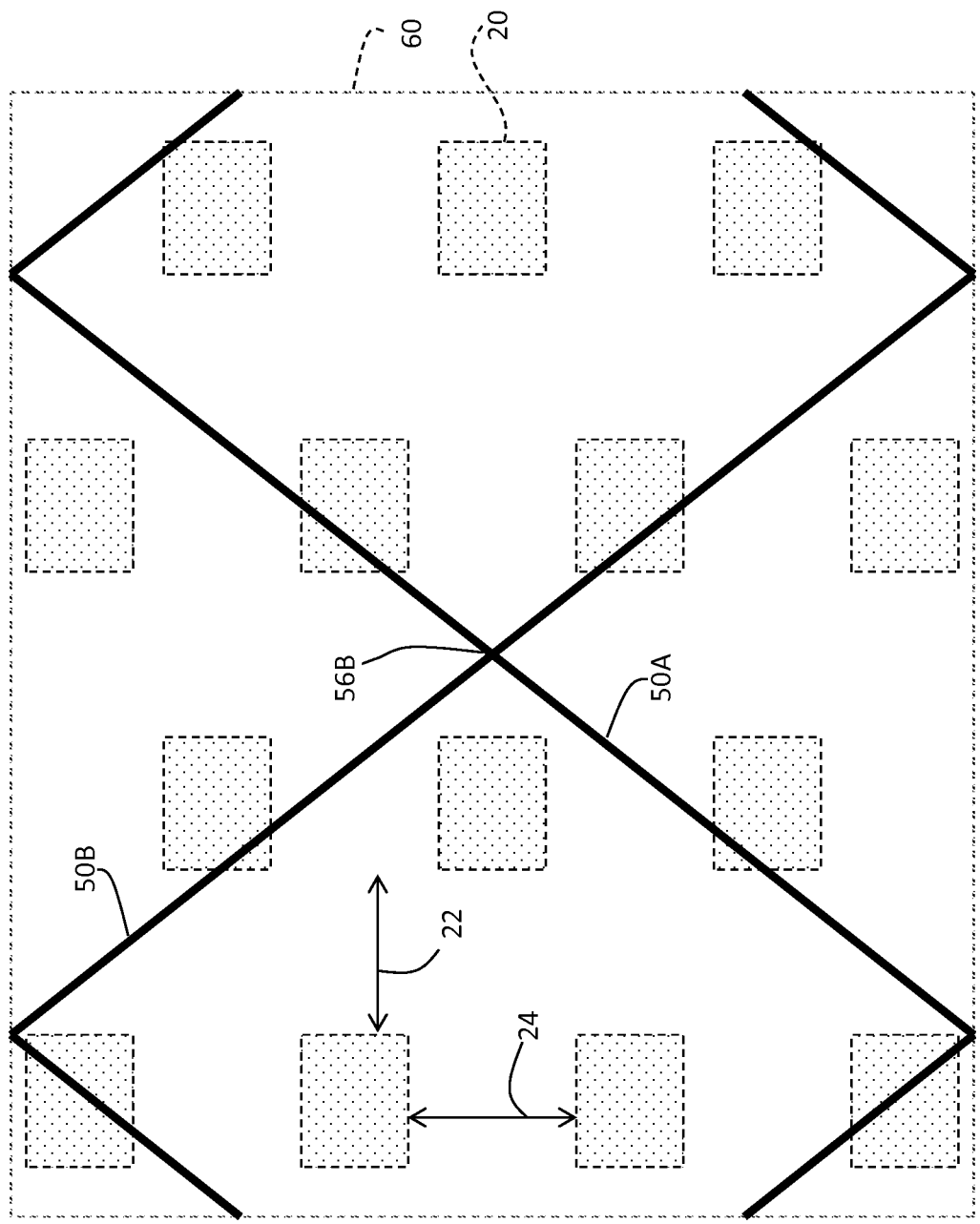

In the embodiment of the present invention illustrated in FIG. 9, pixels 20 are grouped into pixel groups 21 and micro-wire intersections 56B are located between pixel groups 21 in inter-pixel gaps (e.g. 22, 24) but not between pixels 20 within a pixel group 21 in at least one dimension. As shown in FIG. 9, micro-wires 50A, 50B form a diamond-shaped pixel group 21 with four pixels 20 inside each diamond. No micro-wires 50 are located between the four pixels 20 in the pixel group 21. This can be useful, for example, if pixels 20 within a pixel group 21 are light-emitting elements of a full-color pixel 20, for example emitting red, green, and blue light, or red, green, blue, and white light.

In the embodiment illustrated in FIG. 1, first and second electrically separate electrodes 60 are formed over display 40. First and second electrodes 60 have a common length direction L formed over display 40 and extend across at least a portion of the array of pixels 20. First and second electrodes 60 each include a plurality of electrically connected micro-wires 50 formed in the micro-pattern. The micro-pattern in each electrode 60 can be the same micro-pattern, or can be different micro-patterns.

Patterned substrates 30 forming electrodes 60 having micro-wires 50 can be made by methods known in the art and methods further described below. The construction of displays 40 with arrays of pixels 20 in various patterns is also well-known in the art.

Micro-wire patterns that include micro-wire intersections (e.g. micro-wire intersections 56) tend to have undesired material formed or located at the intersections. This undesired material increases the size of micro-wire intersections 56 and can form a regular pattern of dots that is highly visible. By locating micro-wire intersections 56 in inter-pixel gaps 22, 24 between pixels 20, no emitted, reflected, or transmitted light from pixels 20 is occluded so that the larger covered areas 20B of micro-wire intersections 56 are not visible. Thus, the present invention provides improved transparence, as well as reduced optical interference effects.

As will be readily understood by those familiar with the lithographic and display design arts, the terms row and column are arbitrary designations of two different, generally orthogonal dimensions in a two-dimensional arrangement of pixels 20 on a surface, for example a substrate 30 surface, and can be exchanged. That is, a row can be considered as a column and a column considered as a row simply by rotating the surface ninety degrees with respect to a viewer. Hence, electrodes 60 having a length direction L parallel to a row direction can be interchanged with electrodes 60 having a length direction parallel to a column direction depending on the direction of their arrangements on a surface (e.g. a surface of substrate 30 or display substrate 32).

Figure 24:
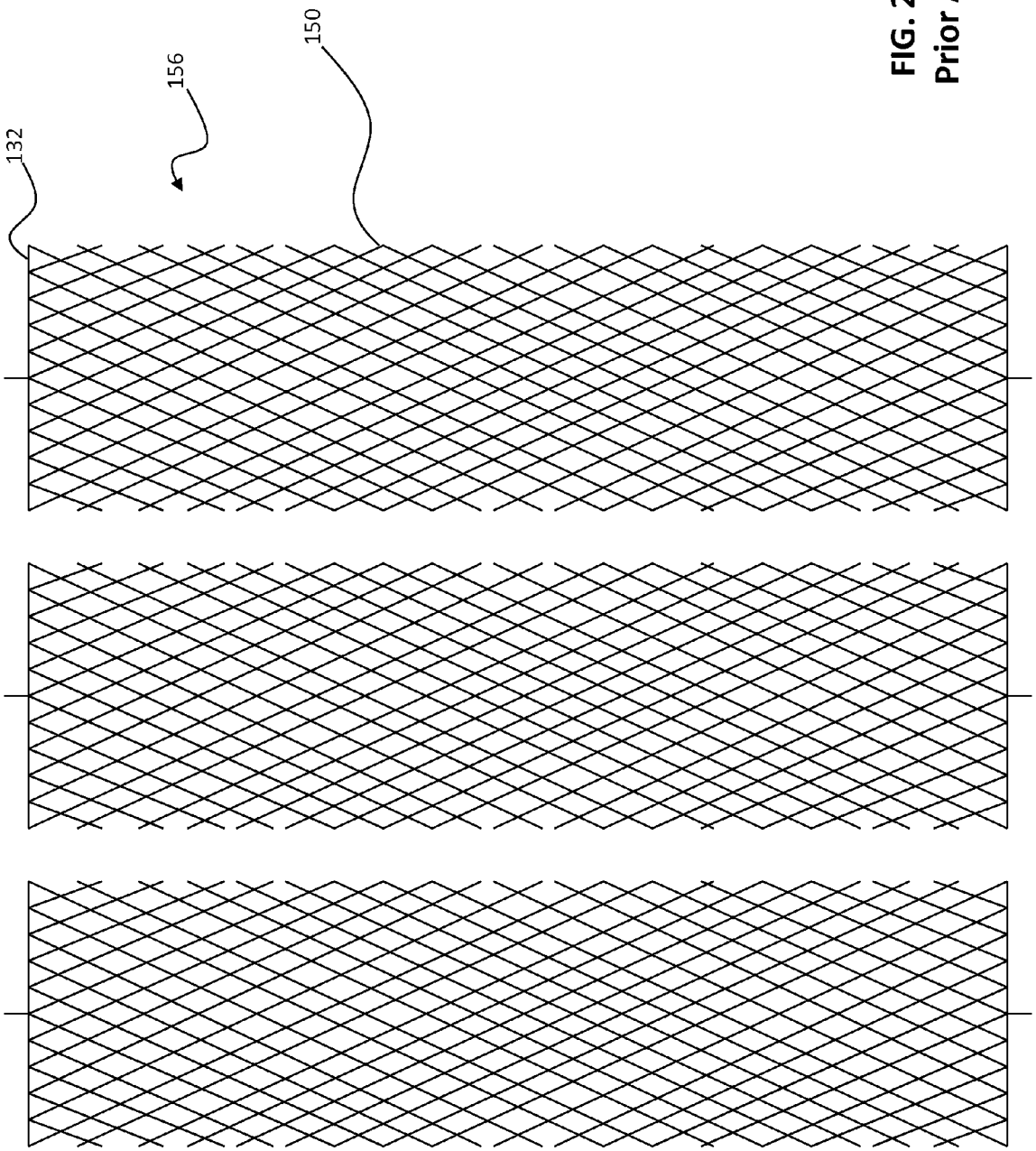
FIGS. 24 and 25 are schematics illustrating prior-art micro-wires arranged in orthogonal transparent electrodes.
Figure 25:
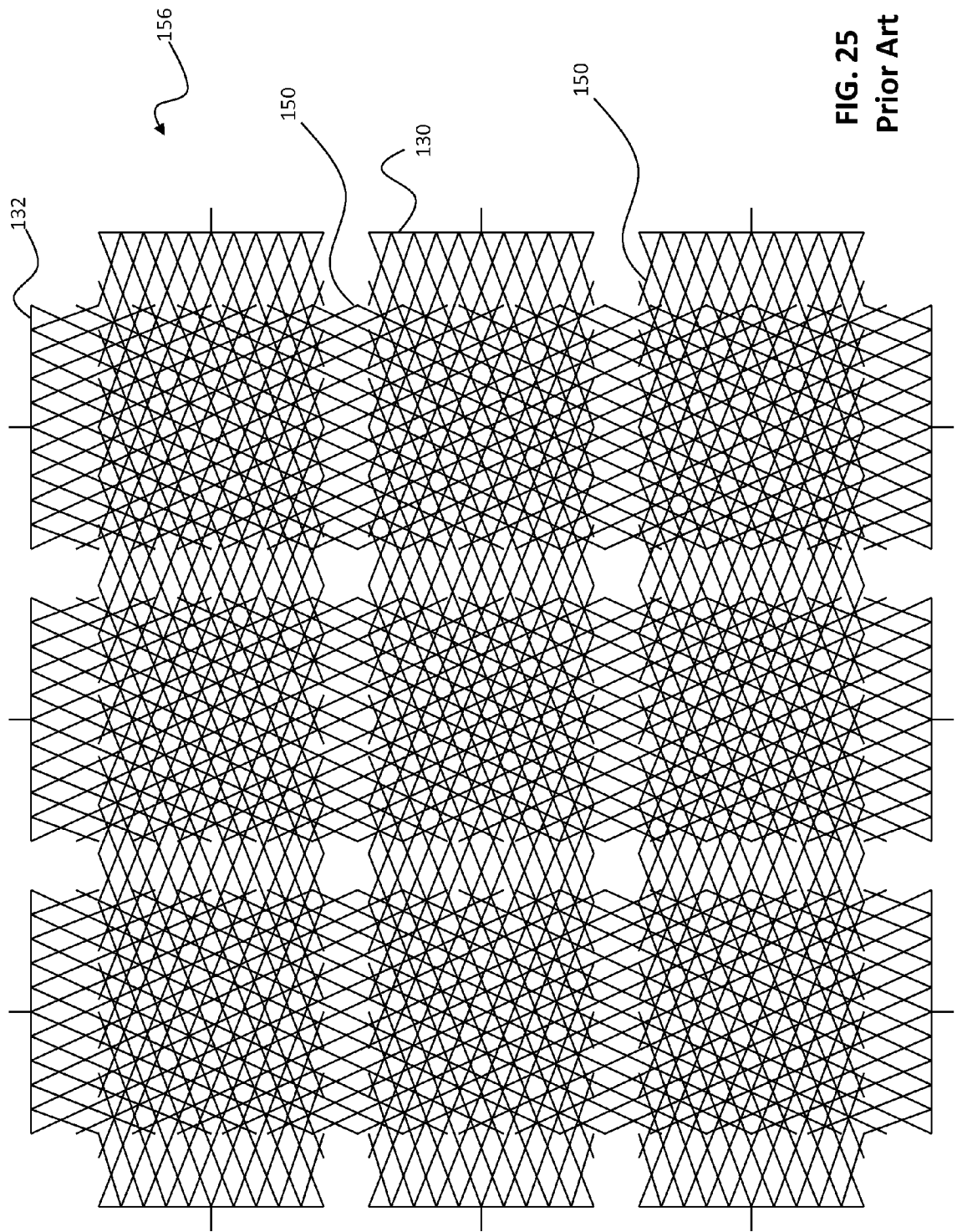

The arrangements of pixels 20 and micro-wires 50 of the present invention were tested on an IBM 22-inch-diagonal high-resolution LCD, with 3840 by 2240 color pixels. The viewing distance was set at 42 feet to model a hand-held display device viewed at a distance of 8 inches. The pattern was displayed by the IrfanView program. Reduced color banding or Moiré effects was observed compared to patterns of the prior art, for example as illustrated in FIG. 24. Simulated LCD sub-pixel size was 32 μm by 104 μm, with a pixel spacing of 108 μm in both horizontal and vertical directions and a sub-pixel gap of 4 μm in both directions. The simulated micro-wire width was 5 μm.

Figure 11:
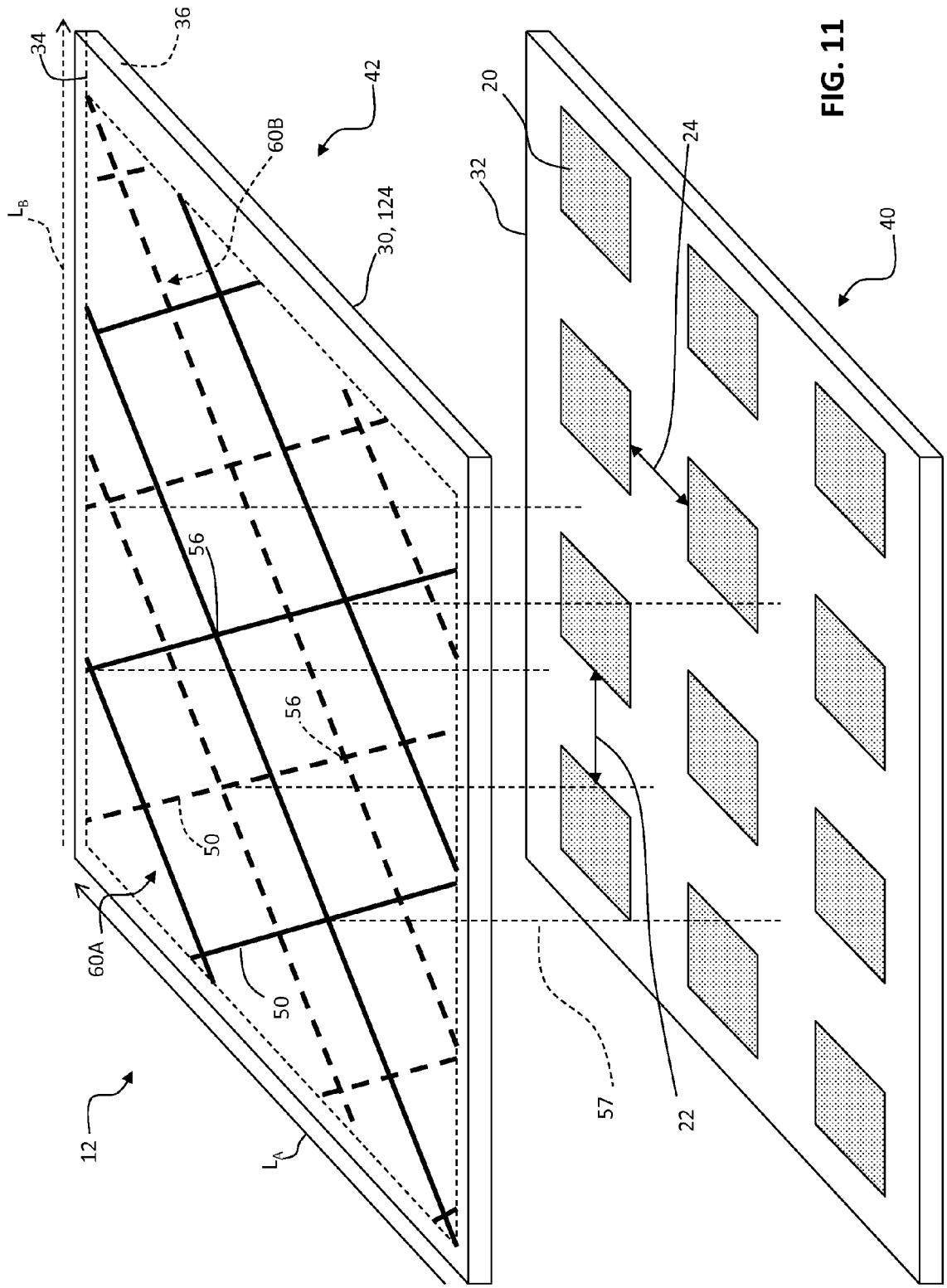
FIG. 11 is an exploded perspective of an embodiment of the present invention.
Figure 12:
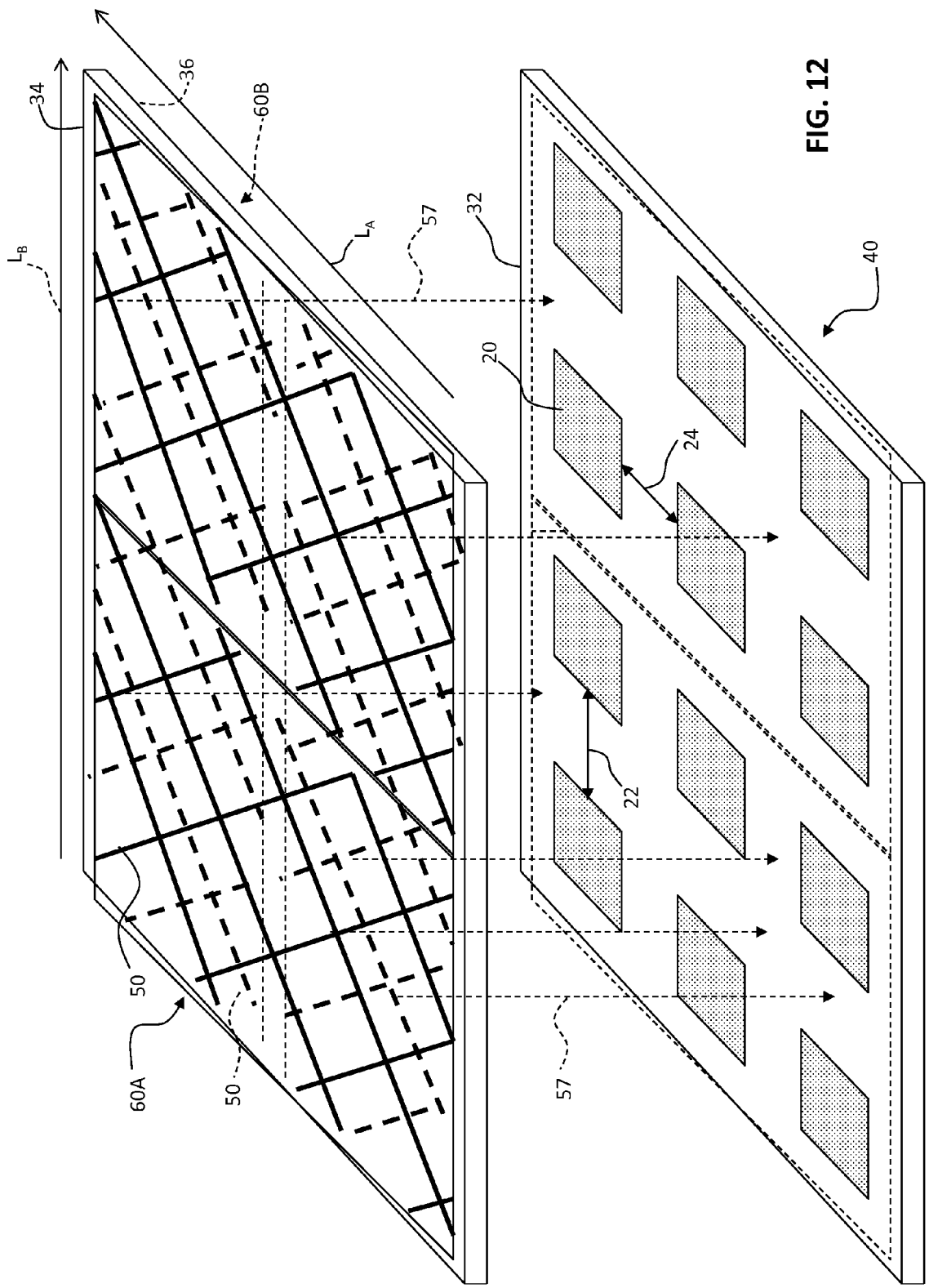
FIG. 12 is an exploded perspective of an embodiment of the present invention having multiple electrodes.

Referring to FIGS. 11 and 12, in an embodiment of the present invention, a display apparatus 12 includes a display 40 having an array of pixels 20 formed on a display substrate 32. Pixels 20 are separated by inter-pixel gaps (e.g. row inter-pixel gaps 24 or column inter-pixel gaps 22) in at least one dimension. A touch screen 42 includes a substrate 30 that is a transparent dielectric layer 124 located over the display 40. Substrate 30 has a first side 34 and a second side 36 opposed to and substantially parallel to the first side 34. A plurality of first electrodes 60A having a first length direction $L_A$ are formed on or over the first side 34 and extend across at least a portion of the array of pixels 20. Each first electrode 60A includes a plurality of electrically connected micro-wires 50 formed in a first micro-pattern. Micro-wires 50 of first electrode 60A are shown with solid lines. A plurality of second electrodes 60B having a second length direction $L_B$ that is orthogonal to first length direction $L_A$ are formed between transparent dielectric layer 124 (e.g. substrate 30) and display 40 and extend across at least a portion of the array of pixels 20. Each second electrode 60B includes a plurality of electrically connected micro-wires 50 formed in a second micro-pattern. Micro-wires 50 of second electrode 60B are shown with dashed lines. As shown in FIG. 1, the first and second micro-patterns each has a first set of parallel micro-wires 50A oriented at a first angle 52 non-orthogonal to the respective length direction and a second set of parallel micro-wires 50B oriented at a second angle 54 non-orthogonal to the respective length direction different from the first angle 52. Micro-wires 50 of the first and second sets intersect to form an array of micro-wire intersections 56. At least every other micro-wire intersection 56 on micro-wires 50 of the first set is located between pixels 20 in inter-pixel gaps (e.g. 22, 24). In another embodiment, all of micro-wire intersections 56 are located between pixels 20 in inter-pixel gaps 22, 24.

Projections 57 in FIGS. 11 and 12 extending orthogonally from the substrate 30 over or under which micro-wires 50 are formed show the location on substrate 30 of micro-wire intersections 56 between pixels 20 formed on or over substrate 30. Micro-wires 50 of first electrode 60A are spatially offset on substrate 30 with respect to micro-wires 50 of second electrode 60B, in either one or both spatial dimensions on substrate 30 (i.e. the x or y dimensions). Micro-wires 50 of first electrode 60A can be spatially 180 degrees out of phase with respect to micro-wires 50 of second electrode 60B. In alternative embodiments, micro-wires 50 of first electrode 60A are aligned with respect to micro-wires 50 of second electrode 60B on substrate 30 so that only micro-wires 50 of first electrode 60A are visible from directly above substrate 30.

FIG. 11 illustrates a portion of a single first electrode 60A on or over first side 34 of substrate 30 extending in first length direction $L_A$ and a portion of a single second electrode 60B on or under opposing second side 36 extending in orthogonal second length direction $L_B$. In FIG. 12, two first electrodes 60A are illustrated with micro-wires 50 shown in solid lines extending in first length direction $L_A$ and two second electrodes 60B are illustrated with micro-wires 50 shown in dashed lines extending in second length direction $L_B$. Projection lines 57 illustrate that at least every other micro-wire intersection 50 on micro-wires 50 is located between pixels 20 in column or row inter-pixel gaps 22, 24. Micro-wires 50 of first electrodes 60A can be formed on, or on layers formed on, first side 34 of substrate 30. Likewise, micro-wires 50 of second electrodes 60B can be formed on, or on layers formed on, second side 36 of substrate 30 so that first electrodes 60A are formed on an opposite side of substrate 30 (transparent dielectric layer 124) than second electrodes 60B.

Figure 13:
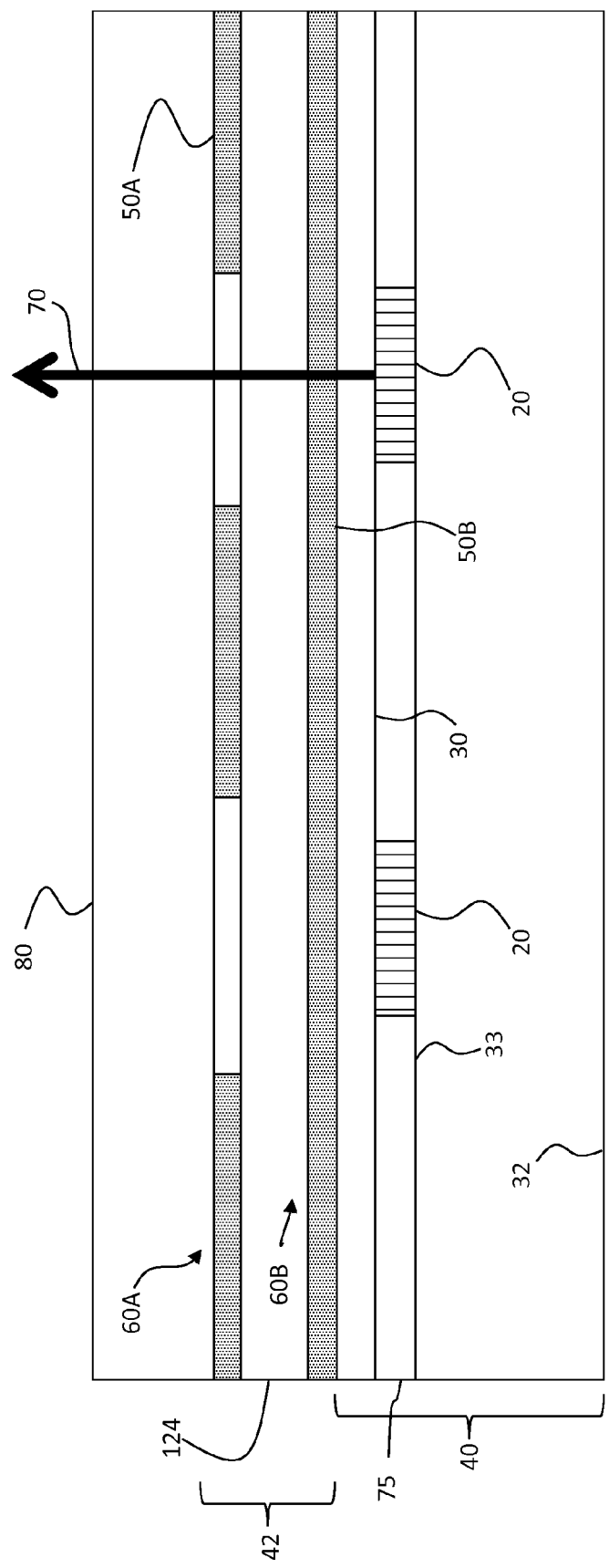
FIGS. 13-16 are cross sections illustrating embodiments of the present invention.

Alternatively, first electrodes 60A or second electrodes 60B can be formed on other substrates. Referring to FIG. 13, a display 40 is integrated with a touch screen 42. Display 40 includes a display substrate 32 having a pixel side 33 on which a light-controlling layer 75 having pixels 20 is formed. Light-controlling layer 75 can be, for example, a patterned light-emissive layer (for example having organic light-emitting diodes) or a patterned light-reflective or light-transmissive layer (for example including liquid crystals) and can include multiple layers including reflective layers. A substrate 30 is located over light-controlling layer 75 and can serve as a cover for display 40. Second electrodes 60B having micro-wires 50B can be formed on the substrate 30 (or on layers formed on substrate 30) on a side of substrate 30 opposite the light-controlling layer 75. A transparent dielectric layer 124 is coated over the second electrodes 60B and first electrodes 60A having micro-wires 50A are formed over transparent dielectric layer 124. A protective cover 80 protects first electrodes 60A. Light 70 emitted or controlled by pixels 20 can pass through substrate 30, between micro-wires 50B, through transparent dielectric layer 124, between micro-wires 50A, and through protective layer 80.

Figure 14:
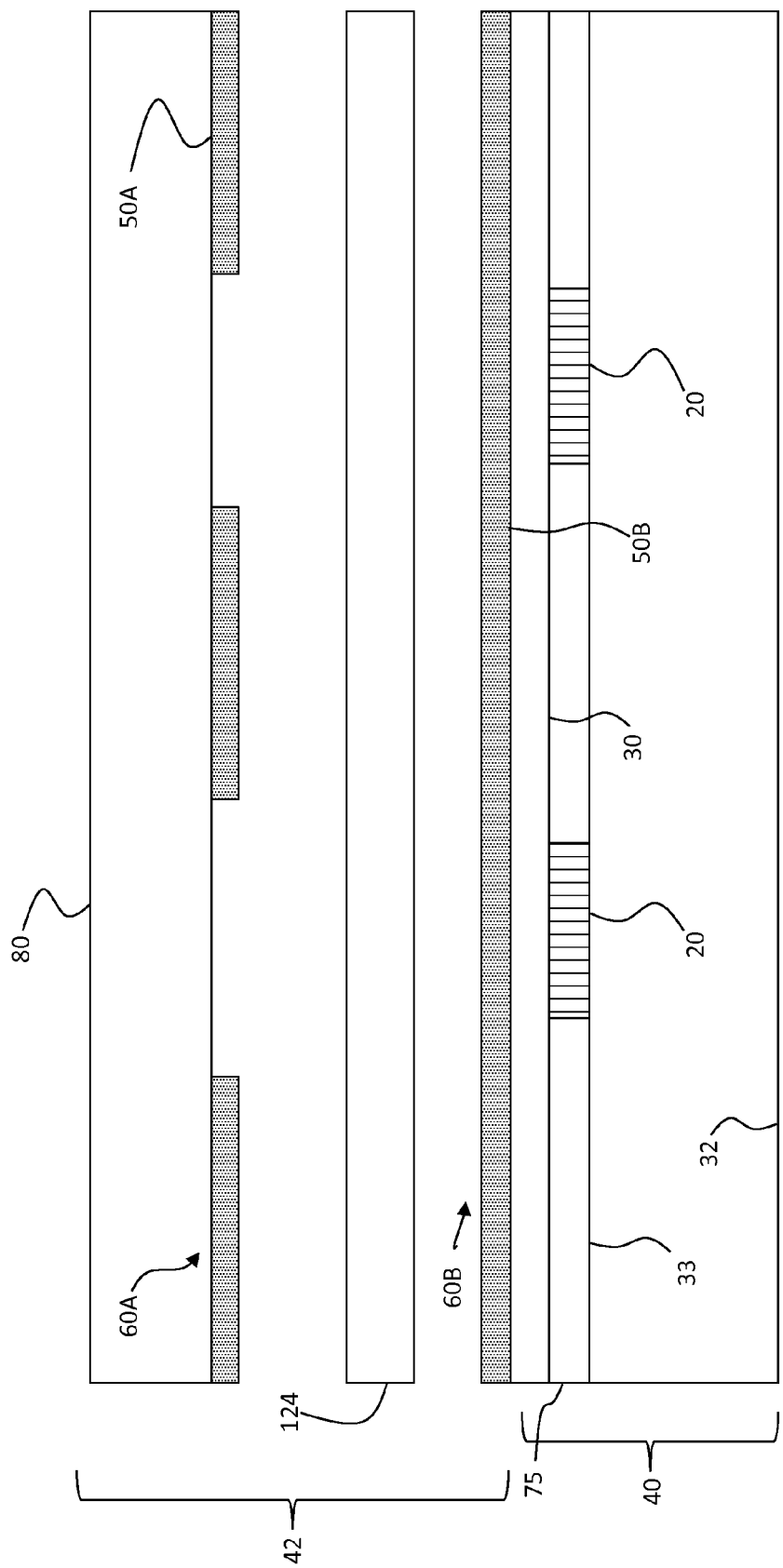

Referring to FIG. 14, in another embodiment, first electrodes 60A having micro-wires 50A are formed on a substrate such as protective layer 80 or on other layers on protective layer 80. As shown in FIG. 14, a display 40 is integrated with a touch screen 42. Display 40 includes a display substrate 32 having a pixel side 33 on which a light-controlling layer 75 having pixels 20 is formed. Light-controlling layer 75 can be, for example, a patterned light-emissive layer (for example having organic light-emitting diodes) or a patterned light-reflective or light-transmissive layer (for example including liquid crystals) and can include multiple layers. A substrate 30 is located over light-controlling layer 75 and can serve as a cover for display 40. Second electrodes 60B having micro-wires 50B can be formed on substrate 30 (or on layers formed on substrate 30) on a side of substrate 30 opposite light-controlling layer 75. A transparent dielectric layer 124 is provided and laminated over second electrodes 60B with protective layer 80 and first electrodes 60A to form a complete assembly.

Figure 15:
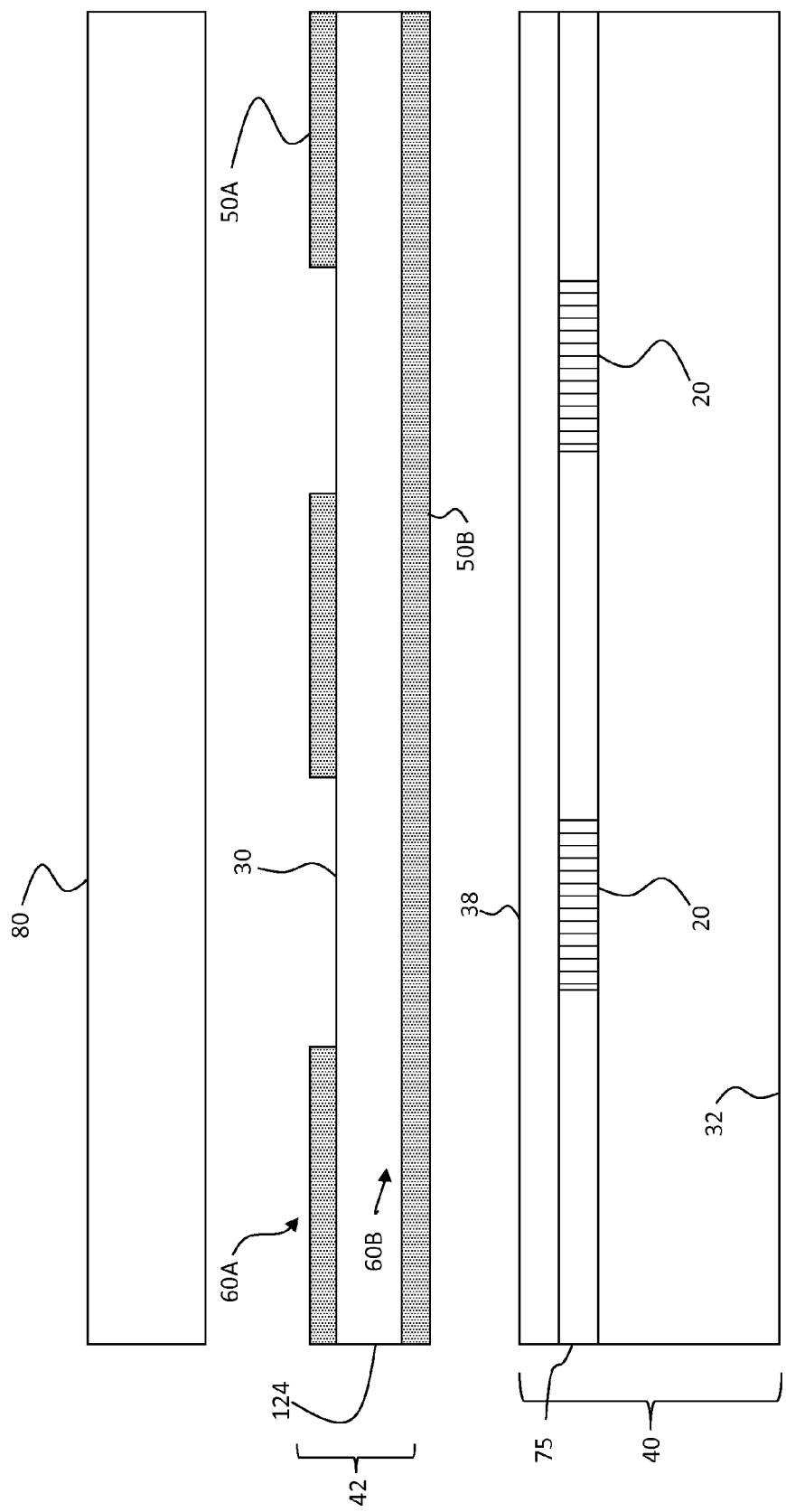

In yet another embodiment shown in FIG. 15, first electrodes 60A having micro-wires 50A and second electrodes 60B having micro-wires 50B of touch screen 42 are formed or located on opposite sides of a substrate 30 forming a transparent dielectric layer 124. Display 40 having display substrate 32, light-controlling layer 75 with pixels 20, and with or without a separate cover 38 is laminated with substrate 30 and first and second electrode 60A, 60B, and protective layer 80 to form a complete assembly.

Figure 16:
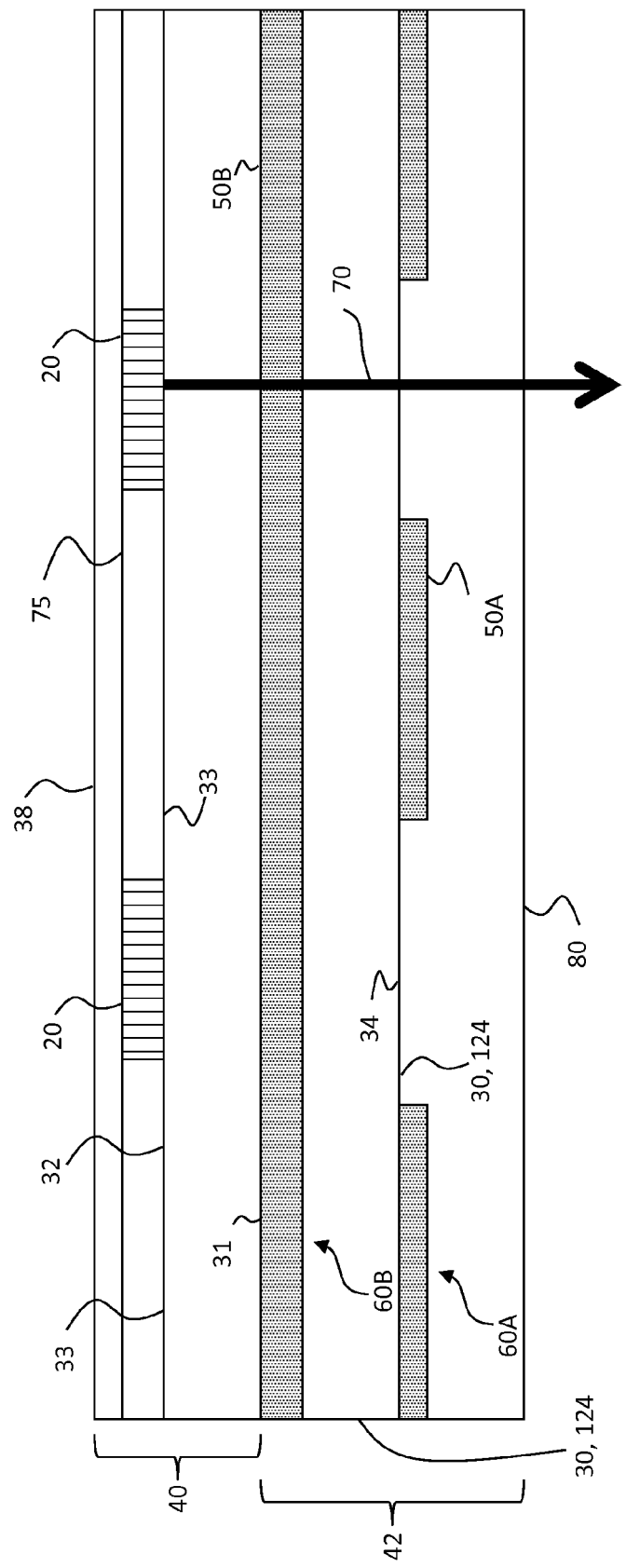

Referring to FIG. 16 in another embodiment, first electrodes 60A or second electrodes 60B can be formed on a display substrate 32 of a display 40. Display substrate 32 has a pixel side 33 on which a light-controlling layer 75 having pixels 20 is formed. Light-controlling layer 75 can be, for example, a patterned light-emissive layer (for example having organic light-emitting diodes) or a patterned light-reflective or light-transmissive layer (for example including liquid crystals) and can include multiple layers. A cover 38 can be formed or provided over light-transmissive layer 75 for protection. Second electrodes 60B having micro-wires 50B can be formed on an electrode side 31 of display substrate 32 (or on layers formed on display substrate 32) on a side of display substrate 32 opposite light-controlling layer 75. Substrate 30 forms transparent dielectric layer 124 over second electrodes 60B and first electrodes 60A having micro-wires 50A are formed over transparent dielectric layer 124. A protective layer 80 protects first electrodes 60A. Light 70 emitted or controlled by pixels 20 can pass through display substrate 32, between micro-wires 50B, through transparent dielectric layer 124 (substrate 30), between micro-wires 50A, and through protective layer 80. The structure illustrated in FIG. 16 can be made using methods and components illustrated in FIGS. 14 and 15. For example, referring to FIG. 14, first electrode 60A can be formed on display substrate 32, second electrode 60B formed on protective layer 80, and laminated with transparent dielectric layer 124 to form a complete assembly. Referring to FIG. 15, first and second electrodes 60A, 60B can be formed on transparent dielectric layer 124 and assembled with display 40 and protective layer 80.

Thus, in an embodiment transparent dielectric layer 124 serves as a first or second substrate on which first or second electrodes 60A, 60B can be formed. Alternatively, a display cover 38 or display substrate 32 serves as a first or second substrate on which first or second electrodes 60A, 60B are formed. In some embodiments, a display cover 38 or display substrate 32 can be transparent dielectric layer 124. In yet another embodiment, a protective layer 80 serves as first or second substrate on which first or second electrodes 60A, 60B is formed.

The micro-wire patterns of first and second electrodes 60A and 60B can be the same micro-pattern or different micro-patterns. The micro-wire patterns of first electrodes 60A can be a rotation or reflection of the micro-wire patterns of second electrodes 60B. Micro-wires 50 of first electrodes 60A can be parallel to micro-wires 50 of second electrodes 60B.

The micro-wire patterns of first and second electrodes 60A and 60B are different from the patterns of first and second electrodes 60A and 60B themselves. For example, in an embodiment, first and second electrodes 60A and 60B form orthogonal arrays of parallel line segments while micro-wires 50 form an array of diamond shapes.

Touch screen 42 can be a capacitive touch screen. In an embodiment, micro-wires 50 are the only conductive element in first or second electrodes 60A, 60B. In another embodiment, micro-wires 50 are combined with other conductive elements, such as transparent conductive oxide materials or conductive polymer materials. In an embodiment, only micro-wires 50 operate to form an electrical field when a voltage differential is applied between micro-wires 50 of first electrode 60A and micro-wires 50 of second electrode 60B.

Figure 20:
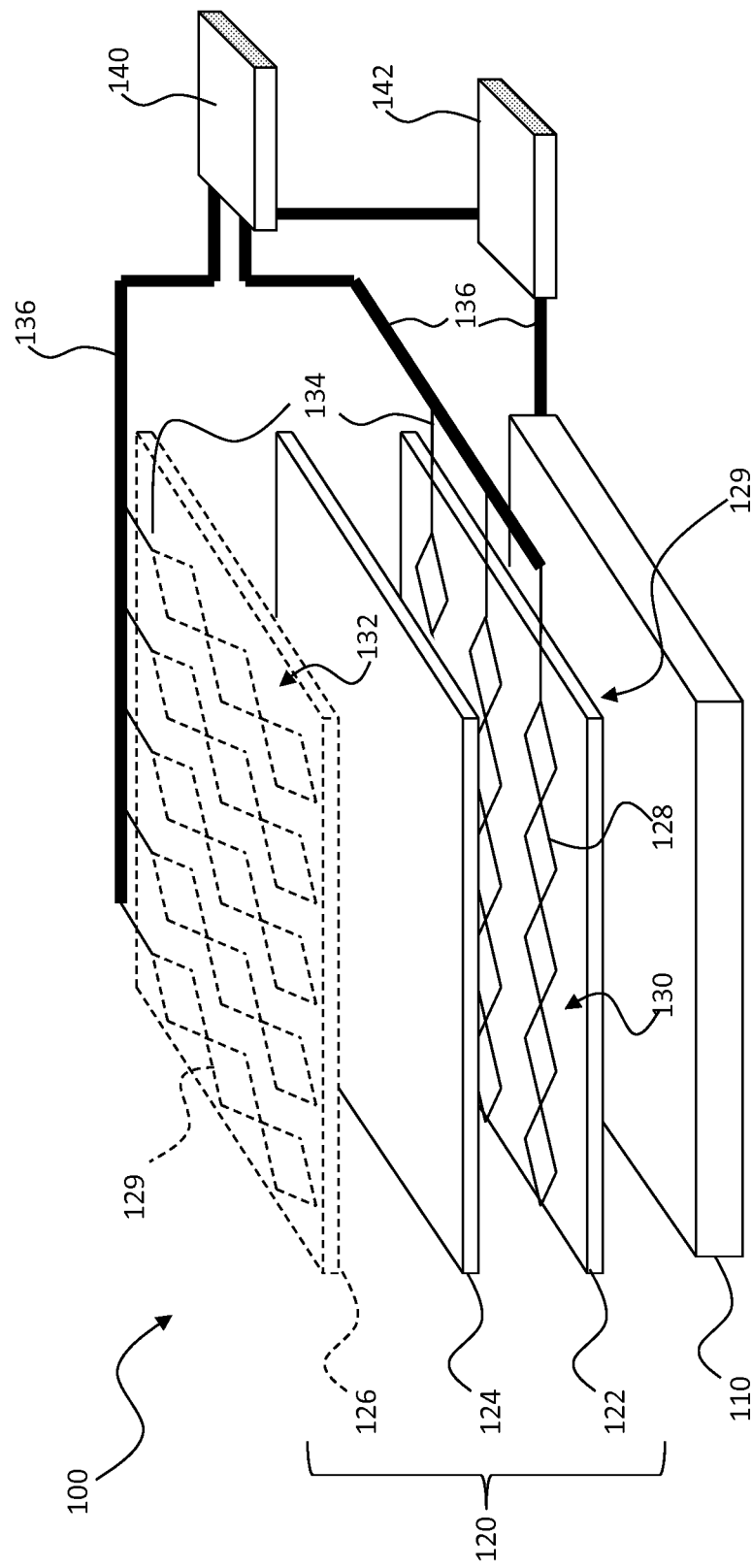
FIG. 20 is an exploded perspective illustrating a prior-art mutual capacitive touch screen having adjacent pad areas in conjunction with a display and controllers.
Figure 21:
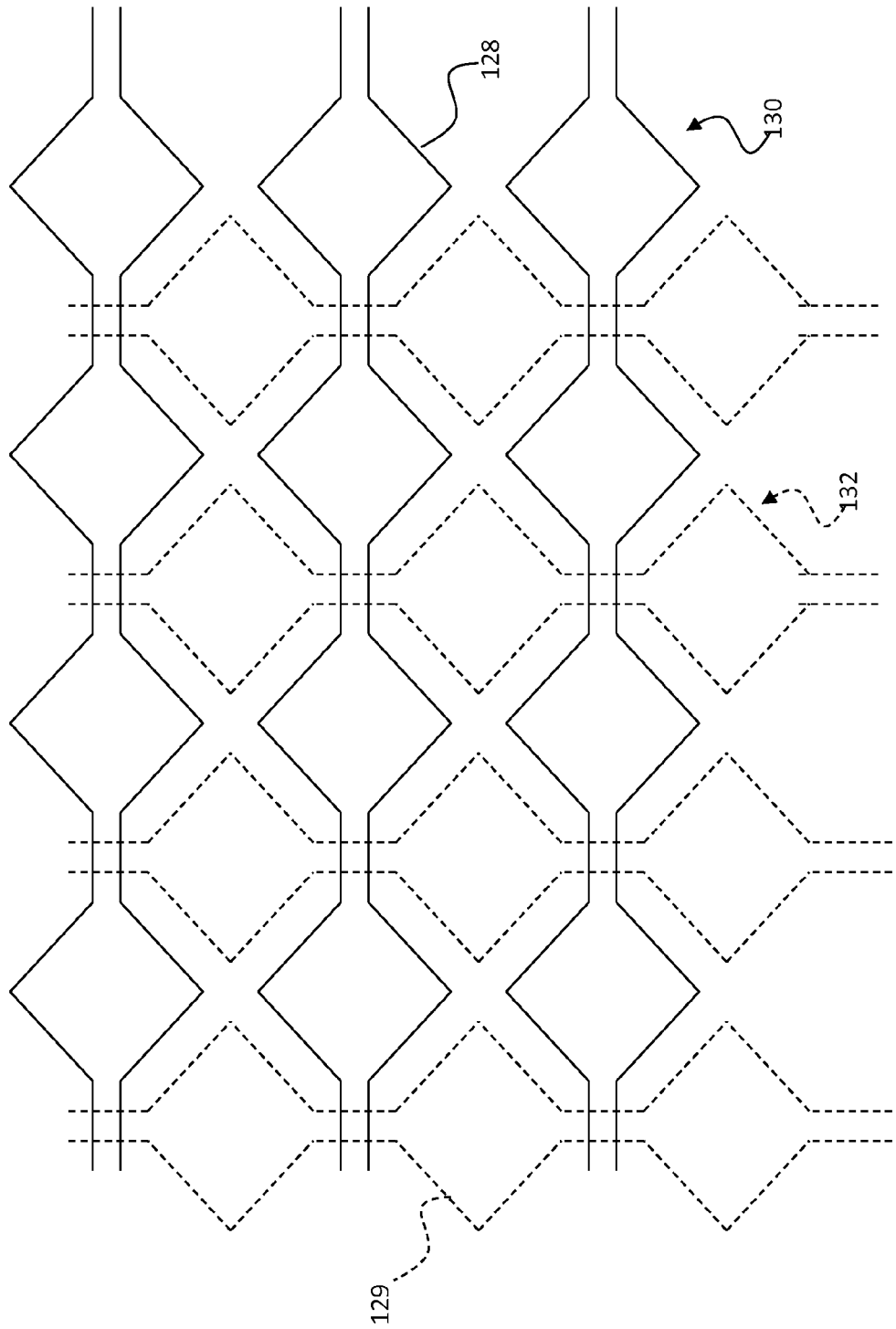
FIG. 21 is a schematic illustrating prior-art adjacent pad areas in a capacitive touch screen.
Figure 22:
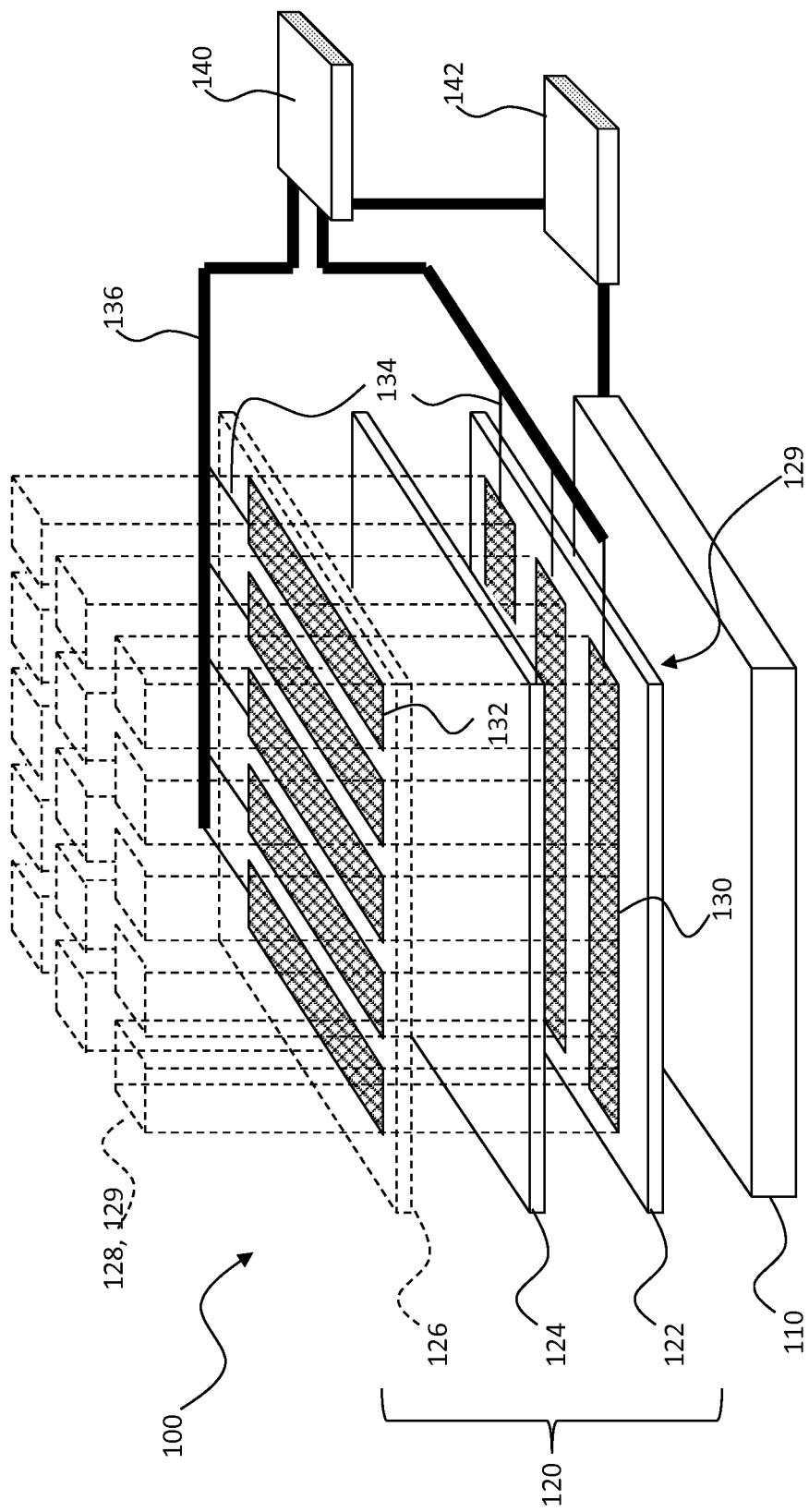
FIG. 22 is an exploded perspective illustrating a prior-art mutual capacitive touch screen having overlapping pad areas in conjunction with a display and controllers.
Figure 23:
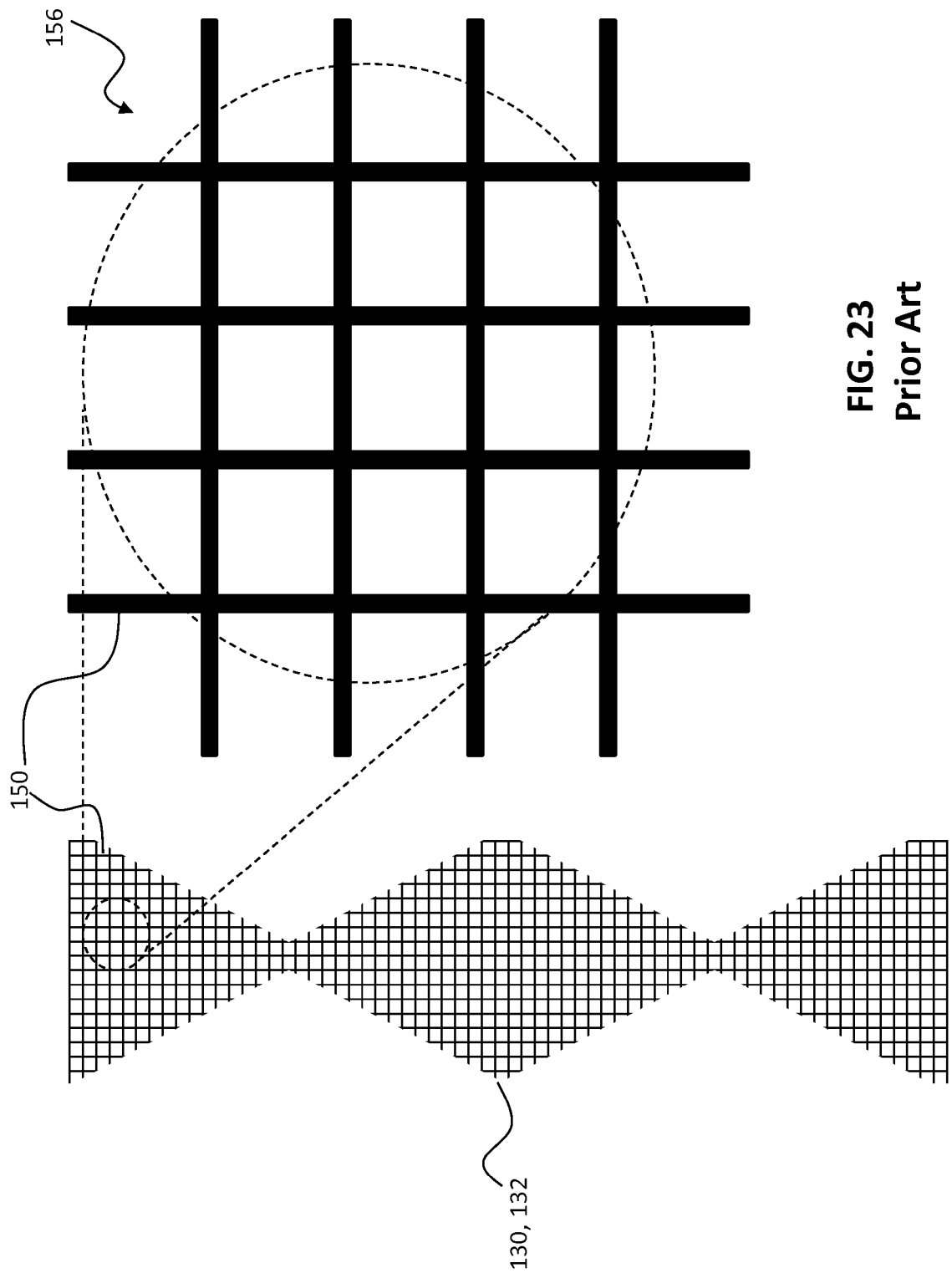
FIG. 23 is a schematic illustrating prior-art micro-wires in an apparently transparent electrode.

Display device 10 of the present invention can be operated by using a display controller 142 (as shown in FIG. 20) to control display 40 to display information with pixels 20. A touch screen controller 140 (as shown in FIG. 20) provides a voltage differential sequentially to first and second electrodes 60A, 60B to scan the capacitance of the capacitor array formed where first and second electrodes 60A, 60B overlap. Any change in the capacitance of a capacitor in the array can indicate a touch at the location of the capacitor in the array. The location of the touch can be related to information presented on one or more pixels 20 at the corresponding pixel location to indicate an action or interest in the information present at the corresponding pixel location.

Figure 17B:
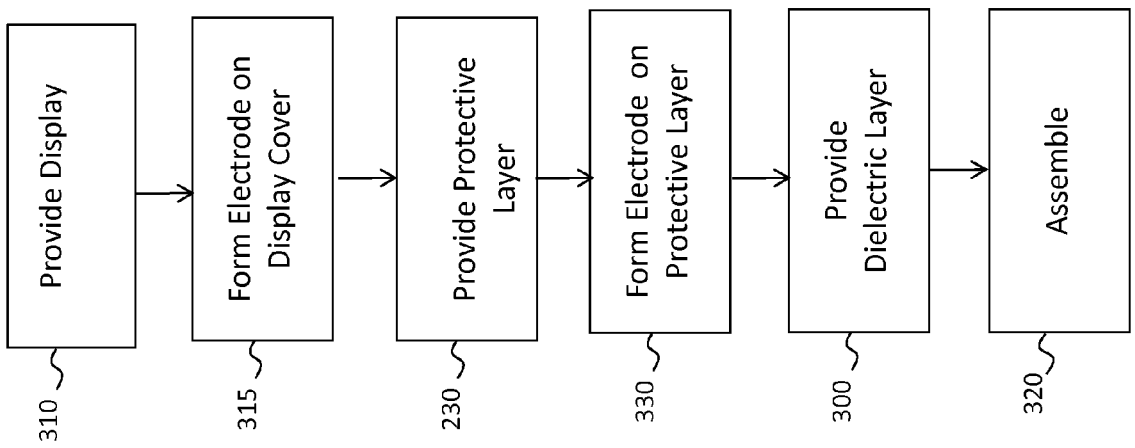
FIGS. 17A-17B are flow diagrams illustrating embodiments of the present invention.
Figure 17A:
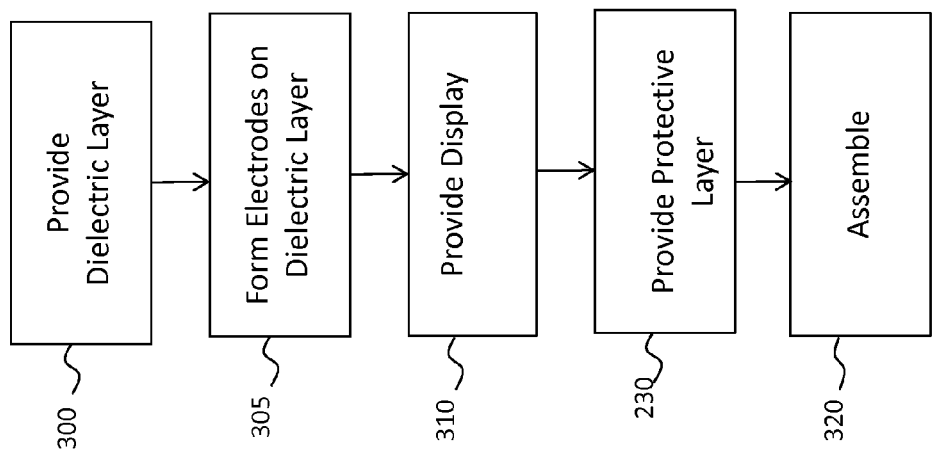

In an embodiment of the present invention, referring to FIG. 17A, a transparent dielectric layer 124 (e.g. substrate 30) is provided 300. Electrodes 60 are formed 305 on either side of transparent dielectric layer 124. A display 40 is provided 310 and a protective layer 80 is provided 230. Display 40, transparent dielectric layer 124 with electrodes 60, and protective layer 80 are assembled 320, for example by aligning and laminating them. Display 40, transparent dielectric layer 124, and protective layer 80 can be provided in any order or at the same time.

Referring to FIG. 17B, a display 40 is provided 310 and an electrode 60 formed on a display cover 38. Display 40 and display cover 38 can be provided separately and assembled or as a unit. An electrode 60 is formed 315 on display cover 38 and protective layer 80 is provided 230. An electrode 60 is formed 330 on protective layer 80. A transparent dielectric layer 124 is provided 300. Display 40, transparent dielectric layer 124, and protective layer 80 are assembled 320, for example by aligning and laminating them. Display 40, transparent dielectric layer 124, and protective layer 80 can be provided in any order or at the same time.

According to further embodiments of the present invention (FIG. 18), a method of making a display device 10 includes providing a first substrate 200 having an array of pixels 20 located in correspondence thereto, pixels 20 separated by column or row inter-pixel gaps (e.g. 22, 24) in at least one dimension. A first electrode 60A is formed 205 having a first length direction $L_A$ located over the first substrate and extending across at least a portion of the array of pixels 20, first electrode 60A including a plurality of electrically connected micro-wires 50 formed in a first micro-pattern.

A display is formed 210 or provided on a side of the first substrate opposite first electrode 60A. A transparent dielectric layer 124 is formed 220 over first electrode 60A or on one or more layers on first electrode 60A and a second electrode 60B is provided 225 over transparent dielectric layer 124. A protective layer 80 or cover is provided 230 or formed over second electrode 60B or on one or more layers on second electrode 60B. In various embodiments, transparent dielectric layer 124 or protective layer 80 is coated or provided and located or assembled with first or second electrodes 60A, 60B.

The first substrate can have a substantially planar pixel side 33 on which the pixels 20 are correspondingly located and a substantially planar electrode side 31 opposed to the pixel side 33. The pixel and electrode sides 33, 31 can be substantially parallel. Pixels 20 are formed on pixel side 33 or on one or more layers on pixel side 33. In various embodiments, first electrode 60A is formed on electrode side 31 or on one or more layers on electrode side 31 before or after display 40 is formed on pixel side 33 of the first substrate. Second electrode 60B has a second length direction $L_B$ and extends across at least a portion of the array of pixels 20 and includes a plurality of electrically connected micro-wires 50 formed in a second micro-pattern.

Both first and second micro-patterns have a first set of parallel micro-wires 50A oriented at a first angle 52 non-orthogonal to length direction $L_A$, $L_B$ of the respective first or second electrode 60A, 60B and a second set of parallel micro-wires 50B oriented at a second angle 54 non-orthogonal to length direction $L_A$, $L_B$ of respective first or second electrode 60A, 60B different from first angle 52. Micro-wires 50A, 50B of the first and second sets intersect to form an array of electrically connected micro-wire intersections 56. At least every other micro-wire intersection 56 on micro-wires 50A of the first set, or micro-wires 50B of the second set is located between pixels 20 in column or row inter-pixel gaps 22, 24.

Figure 19:
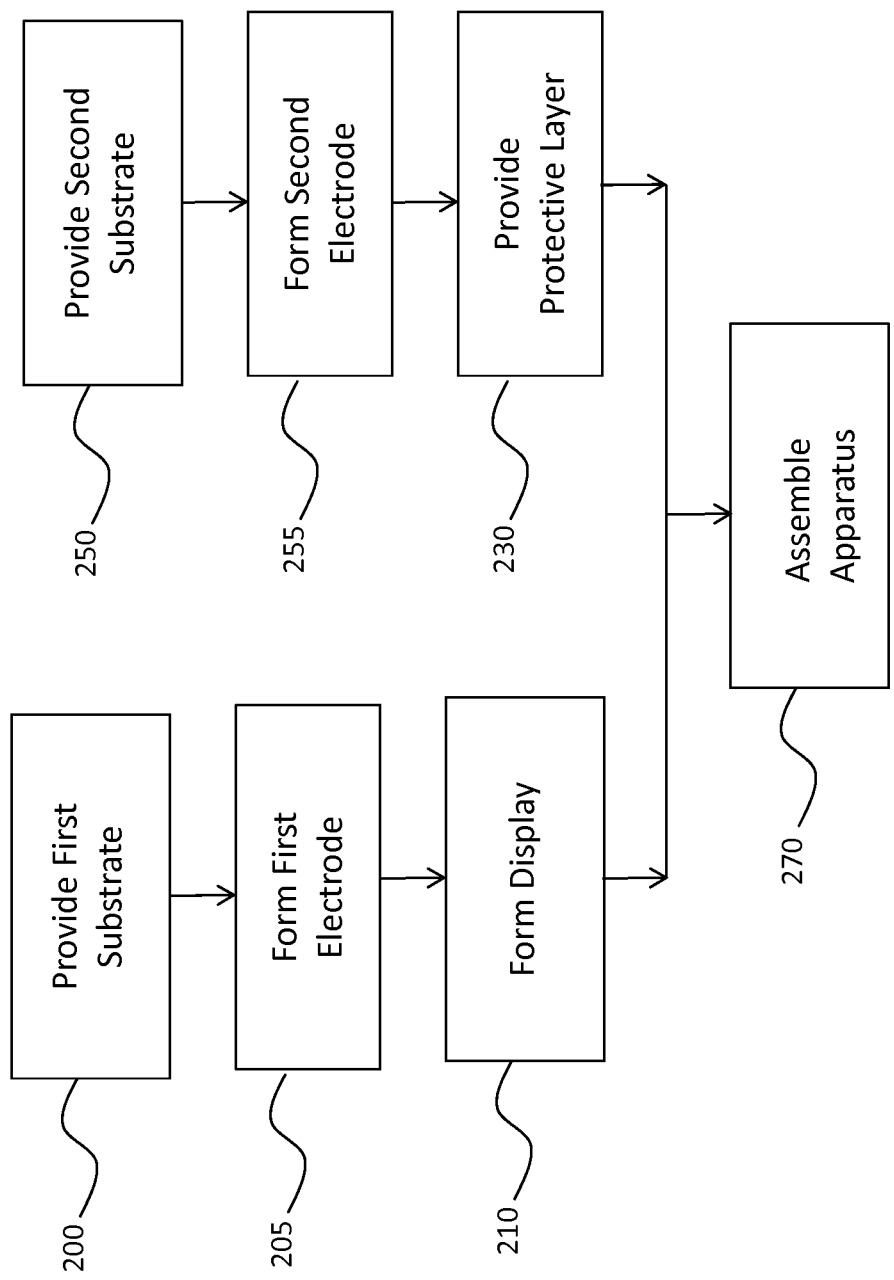

Referring to FIG. 19, in an alternative method of the present invention, a second substrate having a substantially planar first side 34 and a substantially planar second side 36 opposed to first side 34 is provided 250 and located in correspondence to the array of pixels 20. A second electrode 60B is formed 255 on first side 34 or on one or more layers on first side 34, second electrode 60B having a second length direction $L_B$ and extending across at least a portion of the array of pixels 20. Second electrode 60B includes a plurality of electrically connected micro-wires 50 formed in a second micro-pattern that has a first set of parallel micro-wires 50A oriented at a first angle 52 non-orthogonal to length direction $L_A$ and a second set of parallel micro-wires 50B oriented at a second angle 54 non-orthogonal to length direction $L_B$ different from first angle 52, micro-wires 50 of the first and second sets intersecting to form an array of electrically connected micro-wire intersections 56. At least every other micro-wire intersection 56 on micro-wires 50A of the first set is located between pixels 20 in column or row inter-pixel gaps 22, 24. A protective layer 80 is provided 230 and the device assembled 270.

Figure 18:
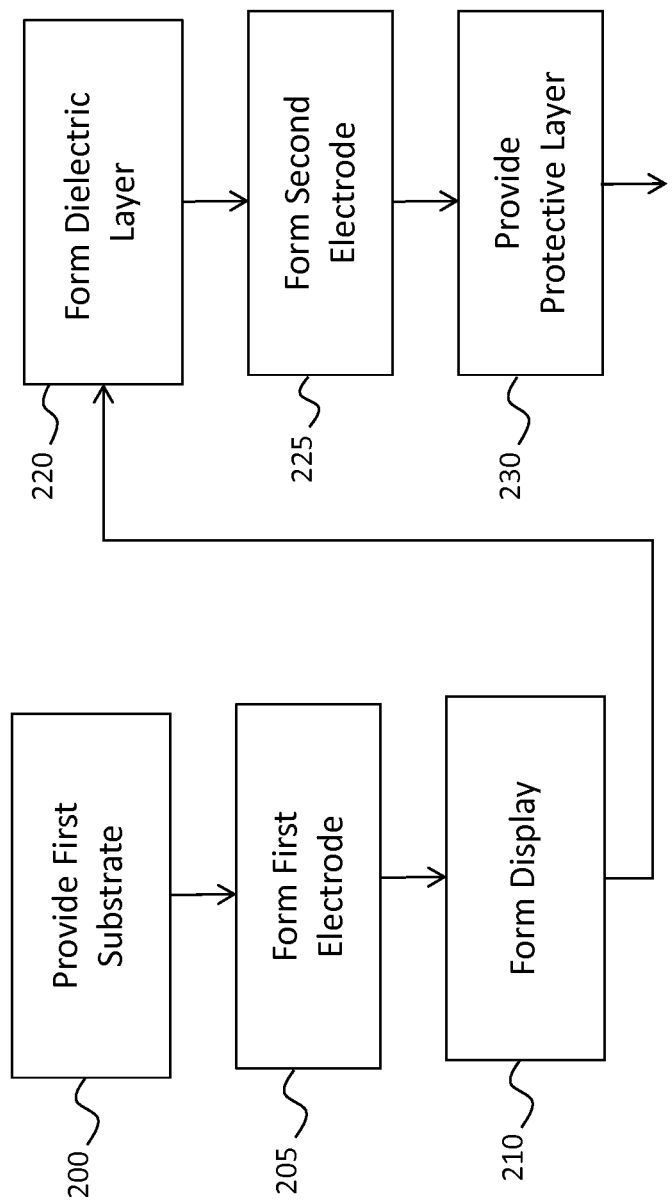
FIGS. 18-19 are flow diagrams illustrating embodiments of the present invention.

The first substrate is provided 200, first electrode 60A formed 205, and display 40 formed 210 as described with respect to FIG. 18 above.

By locating substrates or layers in correspondence is meant that either the layers or substrates are physically aligned or that information describing the layers (e.g. pixels 20) is used to design and make a layer (e.g. electrodes 60) in alignment and the layers or substrates are subsequently assembled in alignment.

In an embodiment, a second substrate is provided or formed as a transparent dielectric layer 124 and is located in a layer between second electrode 60B and first electrode 60A. In a further embodiment, second electrode 60B is located between transparent dielectric layer 124 and the second substrate.

In an embodiment, the pixels 20 are formed on a display substrate 32 or on one or more layers on display substrate 32 and are located between display substrate 32 and substrate 30. Further, in an embodiment first electrode 60A is formed on pixel side 33 or on one or more layers on pixel side 33 of display substrate 32.

In an embodiment, the display substrate (e.g. 32) has a substantially planar pixel side 33 on which pixels 20 are located in correspondence thereto and a substantially planar electrode side 31 opposed to pixel side 33, and first electrode 60A is formed on pixel side 33 or on one or more layers on pixel side 33. A second electrode 60B is formed on electrode side 31, the second electrode 60B having a second length direction $L_B$ and extending across at least a portion of the array of pixels 20, and including a plurality of electrically connected micro-wires 50 formed in a second micro-pattern.

In further embodiments, a protective layer (e.g. 80) is formed or provided on or over second electrode 60B or on one or more layers on or over second electrode 60B or providing a protective substrate on or over second electrode 60B.

In an embodiment, first electrode 60A is formed extending in a first length direction $L_A$ on electrode side 31 and a transparent dielectric layer 124 formed on first electrode 60A or on one or more layers on first electrode 60A. A second electrode 60B is formed on transparent dielectric layer 124 or on one or more layers on transparent dielectric layer 124, second electrode 60B having a second length direction $L_B$ and extending across at least a portion of the array of pixels 20, second electrode 60B including a plurality of electrically connected micro-wires 50 formed in a second micro-pattern. A protective layer 80 can be formed or provided on second electrode 60B or on one or more layers on second electrode 60B, or a protective substrate provided on or over second electrode 60B. In an embodiment, the substrate is provided as a display cover 38 or display substrate 32.

Substrates (e.g. 30, 32) of the present invention can include any material capable of providing a supporting surface on which micro-wires 50 or display elements can be formed and patterned. Substrate materials such as glass, metal, or plastics can be used and are known in the art together with methods for providing suitable surfaces. In a useful embodiment, substrates are substantially transparent, for example having a transparency of greater than 90%, 80% 70% or 50% in the visible range of electromagnetic radiation.

Various substrates (e.g. 30, 32) of the present invention can be similar substrates, for example made of similar materials and having similar material deposited and patterned thereon. Likewise, electrodes 60 of the present invention can be similar, for example made of similar materials using similar processes.

Electrodes 60 of the present invention can be formed directly on substrates (e.g. 30, 32) or over substrates on layers formed on substrates. The words "on", "over', or the phrase "on or over" indicate that micro-wires 50 of electrodes 60 of the present invention can be formed directly on a substrate, on layers formed on a substrate, or on other layers or another substrate located so that electrodes 60 are over the desired substrate. Likewise, electrodes 60 can be formed under or beneath substrates. The words "on", "under", "beneath" or the phrase "on or under" indicate that micro-wires 50 of electrodes 60 of the present invention can be formed directly on a substrate, on layers formed on a substrate, or on other layers or another substrate located so that electrodes 60 are under the desired substrate. "Over" or "under", as used in the present disclosure, are simply relative terms for layers located on or adjacent to opposing sides (e.g. 34, 36) of a substrate 30. By flipping the substrate and related structures over, layers that are over the substrate become under the substrate and layers that are under the substrate become over the substrate. The descriptive use of "over" or "under" do not limit the structures of the present invention.

The length direction (e.g. $L_A$, $L_B$) of an electrode 60 is typically the direction of the greatest spatial extent of an electrode 60 over the substrate 30 on which the electrode 60 is formed. Electrodes 60 formed on or over substrates 30 are typically rectangular in shape, or formed of rectangular elements, with a width and a length much greater than the width. Electrodes 60 are generally used to conduct electricity from a first point on a substrate 30 to a second point and the direction of the electrode 60 from the first point to the second point can be electrode length direction L.

In an embodiment of the present invention, electrodes 60 are variable in width, where the length is the extent of an electrode 60 in length direction L over a substrate 30 and the width is in a direction orthogonal to electrode length direction L. The width variations can be spatially aligned so that, for example one electrode 60 has its narrowest point where an adjacent electrode 60 has its widest point or so that one electrode 60 has its narrowest point where an adjacent electrode 60 has its narrowest point.

A display device 10 of the present invention can be used in a display apparatus 12 including a display 40 and a capacitive touch screen 42, as illustrated in the perspective of FIG. 12. Wires 134, buss connections 136, touch-screen controller 140, and display controller 142 of FIG. 20 can be used to control and operate display device 10 of the present invention, as discussed above with respect to FIG. 20. In response to a voltage differential provided by touch-screen controller 140 (FIG. 20) between electrodes 60 on either side of transparent dielectric layer 124, an electrical field is formed and a capacitance produced. Touch-screen controller 140 (FIG. 20) sequentially energizes the electrodes 60 and senses a capacitance where the electrodes 60 overlap. The capacitance of overlapping or adjacent electrode areas is changed in the presence of a conductive element, such as a finger. The change in capacitance is detected and indicates a touch. By providing an electrode 60 in a display device 10 as disclosed above, the transparency and appearance of the touch screen 42 can be improved.

As used herein, micro-wires 50 in each electrode 60 are micro-wires 50 formed in a micro-wire layer that forms a conductive mesh of electrically connected micro-wires 50. If a transparent substrate (e.g. 122, 126) on which micro-wires 50 are formed is planar, for example, a rigid planar substrate such as a glass substrate, the micro-wires 50 in a micro-wire layer are formed in, or on, a common plane as a conductive, electrically connected mesh. If a transparent substrate (e.g. 122, 126) is flexible and curved, for example a plastic substrate, the micro-wires 50 in a micro-wire layer on the transparent substrate 122, 126 are a conductive, electrically connected mesh that is a common distance from a surface of the flexible, transparent substrate.

In various embodiments, micro-wires 50 can be formed on a transparent substrate 122, 126 or on a layer above (or beneath) the transparent substrate 122, 126. Micro-wires 50 for each of electrodes 60 can be formed on opposing sides of the same transparent substrate 122, 126 or on facing sides of separate transparent substrates 122, 126 or some combination of those arrangements. For example, two substrates 30 can be used on which electrodes 60 of the present invention are formed where one of the substrates 30 serves as a transparent dielectric layer 124 and electrode 60 of the other substrate 30 faces transparent dielectric layer 124 on a side of transparent dielectric layer 124 opposite electrode 60 of transparent dielectric layer 124.

In an example and non-limiting embodiment of the present invention, each micro-wire 50 is 5 microns wide and separated from neighboring micro-wires 50 in an electrode 60 by a distance of 50 microns, so that the transparent electrode is 90% transparent. As used herein, transparent refers to elements that transmit at least 50% of incident visible light, preferably 80% or 90%. Micro-wires 50 can be arranged in a micro-pattern that is unrelated to the pattern of electrodes 60. Micro-patterns other than those illustrated in the Figures can be used in other embodiments and the present invention is not limited by the pattern of electrodes 60 on a substrate 30.

Coating methods for making transparent dielectric layers 124 or protective layers 80 are known in the art and can use, for example, spin or slot coating or extrusion of plastic materials on a substrate 30, or sputtering. Suitable materials are also well known. The formation of patterned electrical wires on a substrate 30 are also known, as are methods of making displays 40, such as OLED or liquid crystal, on a substrate 30 and providing and assembling covers with the substrate 30.

Micro-wires 50 can be metal, for example silver, gold, aluminum, nickel, tungsten, titanium, tin, or copper or various metal alloys including, for example silver, gold, aluminum, nickel, tungsten, titanium, tin, or copper. Other conductive metals or materials can be used. Micro-wires 50 can be made of a thin metal layer. Micro-wires 50 can be, but need not be, opaque. Alternatively, the micro-wires 50A, 50B can include cured or sintered metal particles such as nickel, tungsten, silver, gold, titanium, or tin or alloys such as nickel, tungsten, silver, gold, titanium, or tin. Conductive inks can be used to form micro-wires 50 with pattern-wise deposition and curing steps. Other materials or methods for forming micro-wires 50 can be employed and are included in the present invention.

Micro-wires 50 can be formed by patterned deposition of conductive materials or of patterned precursor materials that can be subsequently processed to form a conductive material.

Suitable methods and materials are known in the art, for example inkjet deposition or screen printing with conductive inks. Alternatively, micro-wires 50 can be formed by providing a blanket deposition of a conductive or precursor material and patterning and curing the deposited material to form a micro-pattern of micro-wires 50. Photo-lithographic and photographic methods are known to perform such processing. The present invention is not limited by the micro-wire materials or by methods of forming a pattern of micro-wires 50 on a supporting substrate surface. U.S. patent application Ser. No. 13/406,649, entitled Transparent Touch-Responsive Capacitor with Variable Pattern Micro-Wires, filed Feb. 28, 2012 by Ronald S. Cok, whose contents are wholly incorporated by reference herein, discloses a variety of materials and methods for forming patterned micro-wires 50 on a substrate surface.

In embodiments of the present invention, micro-wires 50 are made by depositing an unpatterned layer of material on a substrate (e.g. 30) and then differentially exposing the layer to form different micro-wire 50 micro-patterns. For example, a layer of curable precursor material is coated over substrate 30 and pattern-wise exposed. The first and second micro-patterns are exposed in a common step or in different steps. A variety of processing methods can be used, for example photo-lithographic or silver halide methods. The materials can be differentially pattern-wise exposed and then processed.

A variety of materials can be employed to form patterned micro-wires 50, including resins that can be cured by cross-linking wave-length-sensitive polymeric binders and silver halide materials that are exposed to light. Processing can include both washing out residual uncured materials and curing or exposure steps.

In an embodiment, a precursor layer includes conductive ink, conductive particles, or metal ink. The exposed portions of the precursor layer can be cured to form micro-wires 50 (for example by exposure to patterned laser light to cross-link a curable resin) and the uncured portions removed. Alternatively, unexposed portions of the first and second micro-wire layers can be cured to form the micro-wires and the cured portions removed.

In another embodiment of the present invention, the precursor layers are silver salt layers. The silver salt can be any material that is capable of providing a latent image (that is, a germ or nucleus of metal in each exposed grain of metal salt) according to a desired pattern upon photo-exposure. The latent image can then be developed into a metal image. For example, the silver salt can be a photosensitive silver salt such as a silver halide or mixture of silver halides. The silver halide can be, for example, silver chloride, silver bromide, silver chlorobromide, or silver bromoiodide.

According to some embodiments, the useful silver salt is a silver halide (AgX) that is sensitized to any suitable wavelength of exposing radiation. Organic sensitizing dyes can be used to sensitize the silver salt to visible or IR radiation, but it can be advantageous to sensitize the silver salt in the UV portion of the electromagnetic spectrum without using sensitizing dyes.

Processing of AgX materials to form conductive traces typically involves at least developing exposed AgX and fixing (removing) unexposed AgX. Other steps can be employed to enhance conductivity, such as thermal treatments, electroless plating, physical development and various conductivity enhancing baths, e.g., as described in U.S. Pat. No. 3,223,525.

To achieve transparency, the total area occupied by the micro-wires 50 can be less than 15% of the first electrode area and the total area occupied by the micro-wires 50 can be less than 15% of the second electrode area.

In an embodiment, the first and second precursor material layers can each include a metallic particulate material or a metallic precursor material, and a photosensitive binder material.

In any of these cases, the precursor material is conductive after it is cured and any needed processing completed. Before patterning or before curing, the precursor material is not necessarily electrically conductive. As used herein, precursor material is material that is electrically conductive after any final processing is completed and the precursor material is not necessarily conductive at any other point in the micro-wire formation process.

Methods and devices for forming and providing substrates, coating substrates, patterning coated substrates, or pattern-wise depositing materials on a substrate are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen apparatuses are all well known. All of these tools and methods can be usefully employed to design, implement, construct, and operate the present invention. Methods, tools, and devices for operating capacitive touch screens can be used with the present invention.

Although the present invention has been described with emphasis on capacitive touch-screen embodiments, the transparent electrodes are useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

L electrode length direction
$L_A$ first length direction
$L_B$ second length direction
10 display device
12 display apparatus
20 pixel
20A pixel
20B covered area
20C remaining area
20D missing pixel portion
21 pixel group
22 column inter-pixel gap
24 row inter-pixel gap
30 substrate
31 electrode side
32 display substrate
33 pixel side
34 first side
36 second side
38 cover
40 display
42 touch screen
50, 50A, 50B micro-wire 52 first angle
54 second angle
56, 56A, 56B, 56C micro-wire intersection
57 projection lines
60 electrode
60A first electrode
60B second electrode
70 light
75 light-controlling layer
80 protective layer
100 touch screen and display apparatus
110 display
120 touch screen
122 first transparent substrate
124 transparent dielectric layer
126 second transparent substrate
128 first pad area
129 second pad area
130 first transparent electrode
132 second transparent electrode
134 wires
136 buss connections
140 touch-screen controller
142 display controller
150 micro-wire
156 micro-pattern
200 provide first substrate step
205 form first electrodes step
210 form display step
220 form transparent dielectric layer step
225 form second electrode step
230 provide protective layer step
250 form second substrate step
255 form second electrode step
270 assemble device step
300 provide transparent dielectric layer step
305 form electrodes on dielectric layer step
310 provide display step
315 form electrode on display cover step
320 assemble step
330 form electrode on protective layer step

The invention claimed is:

1. A method of making a display device, comprising:
providing a first substrate having an array of pixels located in correspondence thereto, the pixels separated by inter-pixel gaps in at least one dimension;
forming a first electrode having a length direction located over the first substrate and extending across at least a portion of the array of pixels, the first electrode including a plurality of electrically connected micro-wires formed in a first micro-pattern; and
wherein the first micro-pattern has a first set of parallel micro-wires oriented at a first angle non-orthogonal to the length direction and a second set of parallel micro-wires oriented at a second angle non-orthogonal to the length direction different from the first angle, the micro-wires of the first and second sets intersecting to form an array of electrically connected micro-wire intersections; and
wherein at least every other micro-wire intersection on the micro-wires of the first set is located between the pixels in the inter-pixel gaps.

2. The method of claim 1, wherein the first substrate has a substantially planar pixel side on which the pixels are located in correspondence thereto and a substantially planar electrode side opposed to the pixel side, and further including forming the pixels on the pixel side or on one or more layers on the pixel side.

3. The method of claim 1, wherein the first substrate has a substantially planar pixel side on which the pixels are located in correspondence thereto and a substantially planar electrode side opposed to the pixel side, and further including forming the first electrode on the electrode side or on one or more layers on the electrode side.

4. The method of claim 3, further including forming a dielectric layer on the first electrode or on one or more layers on the first electrode.

5. The method of claim 4, further including forming a second electrode on the dielectric layer or on one or more layers on the dielectric layer, the second electrode having a second length direction and extending across at least a portion of the array of pixels, the second electrode including a plurality of electrically connected micro-wires formed in a second micro-pattern; and
wherein the second micro-pattern has a first set of parallel micro-wires oriented at a first angle non-orthogonal to the length direction and a second set of parallel micro-wires oriented at a second angle non-orthogonal to the length direction different from the first angle, the micro-wires of the first and second sets intersecting to form an array of micro-wire intersections; and
wherein at least every other micro-wire intersection on the micro-wires of the first set is located between the pixels in the inter-pixel gaps.

6. The method of claim 5, further including forming or providing a protective layer on the second electrode or on one or more layers on the second electrode.

7. The method of claim 5, further including providing a protective substrate on or over the second electrode.

8. The method of claim 1, further including providing a second substrate having a substantially planar first side and a substantially planar second side opposed to the first side located in correspondence to the array of pixels and forming a second electrode on the first side or on one or more layers on the first side, the second electrode having a second length direction and extending across at least a portion of the array of pixels, the second electrode including a plurality of electrically connected micro-wires formed in a second micro-pattern; and
wherein the second micro-pattern has a first set of parallel micro-wires oriented at a first angle non-orthogonal to the length direction and a second set of parallel micro-wires oriented at a second angle non-orthogonal to the length direction different from the first angle, the micro-wires of the first and second sets intersecting to form an array of micro-wire intersections; and
wherein at least every other micro-wire intersection on the micro-wires of the first set is located between the pixels in the inter-pixel gaps.

9. The method of claim 8, wherein the second substrate is a dielectric layer and further including locating the dielectric layer between the second electrode and the first electrode.

10. The method of claim 8, further including providing a dielectric layer and locating the dielectric layer between the second electrode and the first electrode and the second electrode between the dielectric layer and the second substrate.

11. The method of claim 1, further including providing a display substrate and forming the pixels on the display substrate or on one or more layers on the display substrate and locating the pixels between the display substrate and the first substrate.

12. The method of claim 11, wherein the first substrate has a substantially planar pixel side on which the pixels are located in correspondence thereto and a substantially planar electrode side opposed to the pixel side, and further including forming the first electrode on the pixel side or on one or more layers on the pixel side.

13. The method of claim 12, further including forming a second electrode on the electrode side, the second electrode having a second length direction and extending across at least a portion of the array of pixels, the second electrode including a plurality of electrically connected micro-wires formed in a second micro-pattern; and wherein the second micro-pattern has a first set of parallel micro-wires oriented at a first angle non-orthogonal to the length direction and a second set of parallel micro-wires oriented at a second angle non-orthogonal to the length direction different from the first angle, the micro-wires of the first and second sets intersecting to form an array of micro-wire intersections; and wherein at least every other micro-wire intersection on the micro-wires of the first set is located between the pixels in the inter-pixel gaps.

14. The method of claim 12, further including forming or providing a protective layer on or over the second electrode or on one or more layers on or over the second electrode or providing a protective substrate on or over the second electrode.

15. The method of claim 11, further including forming the first electrode on the electrode side.

16. The method of claim 15, further including forming a dielectric layer on the first electrode or on one or more layers on the first electrode.

17. The method of claim 16, further including forming a second electrode on the dielectric layer or on one or more layers on the dielectric layer, the second electrode having a second length direction and extending across at least a portion of the array of pixels, the second electrode including a plurality of electrically connected micro-wires formed in a second micro-pattern;

wherein the second micro-pattern has a first set of parallel micro-wires oriented at a first angle non-orthogonal to the length direction and a second set of parallel micro-wires oriented at a second angle non-orthogonal to the length direction different from the first angle, the micro-wires of the first and second sets intersecting to form an array of micro-wire intersections; and wherein at least every other micro-wire intersection on the micro-wires of the first set is located between the pixels in the inter-pixel gaps.

18. The method of claim 17, further including forming or providing a protective layer on the second electrode or on one or more layers on the second electrode, or providing a protective substrate on or over the second electrode.

19. The method of claim 1, wherein the substrate is a display cover or display substrate.

* * * * *